US008617313B2

(12) United States Patent  (10) Patent No.: US 8,617,313 B2
Im et al.  (45) Date of Patent: Dec. 31, 2013

(54) LINE SCAN SEQUENTIAL LATERAL SOLIDIFICATION OF THIN FILMS

(75) Inventors: James S. Im, New York, NY (US); Paul C. Van Der Wilt, New York, NY (US)

(73) Assignee: The Trustees of Columbia University in the City of New York, New York, NY (US)

( * ) Notice: Subject to any disclaimer, the term of this patent is extended or adjusted under 35 U.S.C. 154(b) by 0 days.

(21) Appl. No.: 13/547,215

(22) Filed: Jul. 12, 2012

(65) Prior Publication Data
US 2013/0012036 A1  Jan. 10, 2013

Related U.S. Application Data

(63) Continuation of application No. 11/293,655, filed on Dec. 2, 2005, now Pat. No. 8,221,544.

(60) Provisional application No. 60/668,934, filed on Apr. 6, 2005.

(51) Int. Cl.
*C30B 1/04* (2006.01)

(52) U.S. Cl.
USPC ............ 117/202; 117/5; 117/6; 117/8; 117/9; 117/200; 117/201; 359/362

(58) Field of Classification Search
USPC ............... 357/55, 57; 359/362; 117/200, 201, 117/202, 5, 6, 7, 8, 9
See application file for complete search history.

(56) References Cited

U.S. PATENT DOCUMENTS

| 3,632,205 A | 1/1972 | Marcy et al. |
| 4,234,358 A | 11/1980 | Celler et al. |
| 4,309,225 A | 1/1982 | Fan et al. |

(Continued)

FOREIGN PATENT DOCUMENTS

| CN | 1495848 A | 5/2004 |
| CN | 101111925 A | 1/2008 |

(Continued)

OTHER PUBLICATIONS

Bergmann, R. et al., Nucleation and Growth of Crystalline Silicon Films on Glass for Solar Cells, Phys. Stat. Sol., 1998, pp. 587-602, vol. 166, Germany.

(Continued)

*Primary Examiner* — Matthew Song
(74) *Attorney, Agent, or Firm* — Wilmer Cutler Pickering Hale and Dorr LLP

(57) ABSTRACT

A system for preparing a semiconductor film, the system including: a laser source; optics to form a line beam, a stage to support a sample capable of translation; memory for storing a set of instructions, the instructions including irradiating a first region of the film with a first laser pulse to form a first molten zone, said first molten zone having a maximum width ($W_{max}$) and a minimum width ($W_{min}$), wherein the first molten zone crystallizes to form laterally grown crystals; laterally moving the film in the direction of lateral growth a distance greater than about one-half $W_{max}$ and less than $W_{min}$; and irradiating a second region of the film with a second laser pulse to form a second molten zone, wherein the second molten zone crystallizes to form laterally grown crystals that are elongations of the crystals in the first region, wherein laser optics provide $W_{max}$ less than $2 \times W_{min}$.

18 Claims, 15 Drawing Sheets

(56) References Cited

U.S. PATENT DOCUMENTS

| | | |
|---|---|---|
| 4,382,658 A | 5/1983 | Shields et al. |
| 4,456,371 A | 6/1984 | Lin |
| 4,639,277 A | 1/1987 | Hawkins |
| 4,691,983 A | 9/1987 | Kobayashi et al. |
| 4,727,047 A | 2/1988 | Bozler et al. |
| 4,758,533 A | 7/1988 | Magee et al. |
| 4,793,694 A | 12/1988 | Liu |
| 4,800,179 A | 1/1989 | Mukai et al. |
| 4,855,014 A | 8/1989 | Kakimoto et al. |
| 4,870,031 A | 9/1989 | Sugahara et al. |
| 4,940,505 A | 7/1990 | Schachameyer et al. |
| 4,970,546 A | 11/1990 | Suzuki et al. |
| 4,977,104 A | 12/1990 | Sawada et al. |
| 5,032,233 A | 7/1991 | Yu et al. |
| 5,061,655 A | 10/1991 | Ipposhi et al. |
| 5,076,667 A | 12/1991 | Stewart |
| RE33,836 E | 3/1992 | Resor, III et al. |
| 5,145,808 A | 9/1992 | Sameshima et al. |
| 5,173,441 A | 12/1992 | Yu et al. |
| 5,204,659 A | 4/1993 | Sarma |
| 5,233,207 A | 8/1993 | Anzai et al. |
| 5,247,375 A | 9/1993 | Mochizuki |
| 5,281,840 A | 1/1994 | Sarma |
| 5,285,236 A | 2/1994 | Jain |
| 5,291,240 A | 3/1994 | Jain |
| 5,294,811 A | 3/1994 | Aoyama et al. |
| 5,304,357 A | 4/1994 | Sato et al. |
| 5,338,959 A | 8/1994 | Kim et al. |
| 5,373,803 A | 12/1994 | Noguchi et al. |
| 5,395,481 A | 3/1995 | McCarthy |
| 5,409,867 A | 4/1995 | Asano et al. |
| 5,453,594 A | 9/1995 | Konecny |
| 5,456,763 A | 10/1995 | Kaschmitter et al. |
| 5,496,768 A | 3/1996 | Kudo et al. |
| 5,512,494 A | 4/1996 | Tanabe et al. |
| 5,523,193 A | 6/1996 | Nelson |
| 5,529,951 A | 6/1996 | Noguchi et al. |
| 5,571,430 A | 11/1996 | Kawasaki et al. |
| 5,591,668 A | 1/1997 | Maegawa et al. |
| 5,663,579 A | 9/1997 | Noguchi |
| 5,683,935 A | 11/1997 | Miyamoto |
| 5,710,050 A | 1/1998 | Makita et al. |
| 5,721,606 A | 2/1998 | Jain |
| 5,742,426 A | 4/1998 | York |
| 5,756,364 A | 5/1998 | Tanaka et al. |
| 5,766,989 A | 6/1998 | Maegawa et al. |
| 5,767,003 A | 6/1998 | Noguchi |
| 5,817,548 A | 10/1998 | Noguchi et al. |
| 5,844,588 A | 12/1998 | Anderson |
| 5,858,807 A | 1/1999 | Kawamura |
| 5,861,991 A | 1/1999 | Fork |
| 5,893,990 A | 4/1999 | Tanaka et al. |
| 5,948,291 A | 9/1999 | Neylan et al. |
| 5,960,323 A | 9/1999 | Wakita et al. |
| 5,986,807 A | 11/1999 | Fork |
| 6,002,523 A | 12/1999 | Tanaka |
| 6,014,944 A | 1/2000 | Aklufi et al. |
| 6,020,224 A | 2/2000 | Shimogaichi et al. |
| 6,020,244 A | 2/2000 | Thompson et al. |
| 6,045,980 A | 4/2000 | Edelkind et al. |
| 6,072,631 A | 6/2000 | Guenther et al. |
| 6,081,381 A | 6/2000 | Shalapenok et al. |
| 6,117,752 A | 9/2000 | Suzuki et al. |
| 6,120,976 A | 9/2000 | Treadwell et al. |
| 6,130,009 A | 10/2000 | Smith et al. |
| 6,130,455 A | 10/2000 | Yoshinouchi et al. |
| 6,136,632 A | 10/2000 | Higashi |
| 6,156,997 A | 12/2000 | Yamazaki et al. |
| 6,162,711 A | 12/2000 | Ma et al. |
| 6,169,014 B1 | 1/2001 | McCulloch et al. |
| 6,172,820 B1 | 1/2001 | Kuwahara et al. |
| 6,176,922 B1 | 1/2001 | Aklufi et al. |
| 6,177,301 B1 | 1/2001 | Jung et al. |
| 6,184,490 B1 | 2/2001 | Schweizer |
| 6,187,088 B1 | 2/2001 | Okumura et al. |
| 6,190,985 B1 | 2/2001 | Buynoski |
| 6,193,796 B1 | 2/2001 | Yang et al. |
| 6,203,952 B1 | 3/2001 | O'Brien et al. |
| 6,235,614 B1 | 5/2001 | Yang et al. |
| 6,242,291 B1 | 6/2001 | Kusumoto et al. |
| 6,274,488 B1 | 8/2001 | Talwar et al. |
| 6,285,001 B1 | 9/2001 | Fleming et al. |
| 6,300,175 B1 | 10/2001 | Moon et al. |
| 6,313,435 B1 | 11/2001 | Shoemaker et al. |
| 6,316,338 B1 | 11/2001 | Jung et al. |
| 6,320,227 B1 | 11/2001 | Lee et al. |
| 6,322,625 B2 | 11/2001 | Im |
| 6,326,186 B1 | 12/2001 | Kirk et al. |
| 6,326,215 B1 | 12/2001 | Keen |
| 6,326,286 B1 | 12/2001 | Park et al. |
| 6,333,232 B1 | 12/2001 | Kunikiyo et al. |
| 6,341,042 B1 | 1/2002 | Matsunaka et al. |
| 6,348,990 B1 | 2/2002 | Igasaki et al. |
| 6,353,218 B1 | 3/2002 | Yamazaki et al. |
| 6,358,784 B1 | 3/2002 | Zhang et al. |
| 6,368,945 B1 | 4/2002 | Im |
| 6,387,178 B1 | 5/2002 | Geho et al. |
| 6,388,146 B1 | 5/2002 | Onishi et al. |
| 6,388,386 B1 | 5/2002 | Kunii et al. |
| 6,392,810 B1 | 5/2002 | Tanaka et al. |
| 6,393,042 B1 | 5/2002 | Tanaka et al. |
| 6,407,012 B1 | 6/2002 | Miyasaka et al. |
| 6,410,373 B1 | 6/2002 | Chang et al. |
| 6,429,100 B2 | 8/2002 | Yoneda et al. |
| 6,432,758 B1 | 8/2002 | Cheng et al. |
| 6,437,284 B1 | 8/2002 | Okamoto et al. |
| 6,444,506 B1 | 9/2002 | Kusumoto et al. |
| 6,445,359 B1 | 9/2002 | Ho |
| 6,448,612 B1 | 9/2002 | Miyazaki et al. |
| 6,451,631 B1 | 9/2002 | Grigoropoulos et al. |
| 6,455,359 B1 | 9/2002 | Yamazaki et al. |
| 6,468,845 B1 | 10/2002 | Nakajima et al. |
| 6,471,772 B1 | 10/2002 | Tanaka |
| 6,472,684 B1 | 10/2002 | Yamazaki et al. |
| 6,476,447 B1 | 11/2002 | Yamazaki et al. |
| 6,479,837 B1 | 11/2002 | Ogawa et al. |
| 6,482,722 B2 | 11/2002 | Kunii et al. |
| 6,493,042 B1 | 12/2002 | Bozdagi et al. |
| 6,495,067 B1 | 12/2002 | Ono et al. |
| 6,495,405 B2 | 12/2002 | Voutsas et al. |
| 6,501,095 B2 | 12/2002 | Yamaguchi et al. |
| 6,504,175 B1 | 1/2003 | Mei et al. |
| 6,506,636 B2 | 1/2003 | Yamazaki et al. |
| 6,511,718 B1 | 1/2003 | Paz de Araujo et al. |
| 6,512,634 B2 | 1/2003 | Tanaka et al. |
| 6,516,009 B1 | 2/2003 | Tanaka et al. |
| 6,521,492 B2 | 2/2003 | Miyasaka et al. |
| 6,526,585 B1 | 3/2003 | Hill |
| 6,528,359 B2 | 3/2003 | Kusumoto et al. |
| 6,531,681 B1 | 3/2003 | Markle et al. |
| 6,535,535 B1 | 3/2003 | Yamazaki et al. |
| 6,555,422 B1 | 4/2003 | Yamazaki et al. |
| 6,555,449 B1 | 4/2003 | Im et al. |
| 6,563,077 B2 | 5/2003 | Im |
| 6,573,163 B2 | 6/2003 | Voutsas et al. |
| 6,573,531 B1 | 6/2003 | Im et al. |
| 6,577,380 B1 | 6/2003 | Sposili et al. |
| 6,582,827 B1 | 6/2003 | Im |
| 6,590,228 B2 | 7/2003 | Voutsas et al. |
| 6,608,326 B1 | 8/2003 | Shinagawa et al. |
| 6,621,044 B2 | 9/2003 | Jain et al. |
| 6,635,554 B1 | 10/2003 | Im et al. |
| 6,635,932 B2 | 10/2003 | Grigoropoulos et al. |
| 6,667,198 B2 | 12/2003 | Shimoto et al. |
| 6,693,258 B2 | 2/2004 | Sugano et al. |
| 6,734,635 B2 | 5/2004 | Kunii et al. |
| 6,741,621 B2 | 5/2004 | Asano |
| 6,750,424 B2 | 6/2004 | Tanaka |
| 6,755,909 B2 | 6/2004 | Jung |
| 6,784,455 B2 | 8/2004 | Maekawa et al. |
| 6,830,993 B1 | 12/2004 | Im et al. |
| 6,858,477 B2 | 2/2005 | Deane et al. |
| 6,860,939 B2 | 3/2005 | Hartzell |
| 6,908,835 B2 | 6/2005 | Sposili et al. |

(56) References Cited

U.S. PATENT DOCUMENTS

| | | |
|---|---|---|
| 6,916,690 B2 | 7/2005 | Chang |
| 6,961,117 B2 | 11/2005 | Im |
| 6,962,860 B2 | 11/2005 | Yamazaki et al. |
| 6,984,573 B2 | 1/2006 | Yamazaki et al. |
| 7,029,996 B2 | 4/2006 | Im et al. |
| 7,078,281 B2 | 7/2006 | Tanaka et al. |
| 7,078,793 B2 | 7/2006 | Ruckerbauer et al. |
| 7,091,411 B2 | 8/2006 | Falk et al. |
| 7,115,503 B2 | 10/2006 | Im |
| 7,119,365 B2 | 10/2006 | Takafuji et al. |
| 7,132,204 B2 | 11/2006 | Jung |
| 7,144,793 B2 | 12/2006 | Gosain et al. |
| 7,164,152 B2 | 1/2007 | Im |
| 7,183,229 B2 | 2/2007 | Yamanaka |
| 7,187,016 B2 | 3/2007 | Arima |
| 7,189,624 B2 | 3/2007 | Ito |
| 7,192,479 B2 | 3/2007 | Mitani et al. |
| 7,192,818 B1 | 3/2007 | Lee et al. |
| 7,199,397 B2 | 4/2007 | Huang et al. |
| 7,217,605 B2 | 5/2007 | Kawasaki et al. |
| 7,297,982 B2 | 11/2007 | Suzuki et al. |
| 7,311,778 B2 | 12/2007 | Im et al. |
| 7,318,866 B2 | 1/2008 | Im |
| 7,326,876 B2 | 2/2008 | Jung |
| 7,364,952 B2 | 4/2008 | Im |
| 7,399,359 B2 | 7/2008 | Im et al. |
| 7,645,337 B2 | 1/2010 | Im et al. |
| 7,700,462 B2 | 4/2010 | Tanaka et al. |
| 7,804,647 B2 | 9/2010 | Mitani et al. |
| 2001/0001745 A1 | 5/2001 | Im et al. |
| 2001/0029089 A1 | 10/2001 | Tanaka |
| 2001/0030292 A1 | 10/2001 | Brotherton |
| 2001/0041426 A1 | 11/2001 | Im |
| 2002/0083557 A1 | 7/2002 | Jung |
| 2002/0104750 A1 | 8/2002 | Ito |
| 2002/0119609 A1 | 8/2002 | Hatano et al. |
| 2002/0151115 A1 | 10/2002 | Nakajima et al. |
| 2002/0179004 A1 | 12/2002 | Jung |
| 2002/0197778 A1 | 12/2002 | Kasahara et al. |
| 2003/0006221 A1 | 1/2003 | Hong et al. |
| 2003/0013278 A1 | 1/2003 | Jang et al. |
| 2003/0013280 A1 | 1/2003 | Yamanaka |
| 2003/0022471 A1 | 1/2003 | Taketomi et al. |
| 2003/0029212 A1 | 2/2003 | Im |
| 2003/0057418 A1 | 3/2003 | Asano |
| 2003/0060026 A1 | 3/2003 | Yamazaki et al. |
| 2003/0068836 A1 | 4/2003 | Hongo et al. |
| 2003/0088848 A1 | 5/2003 | Crowder |
| 2003/0096489 A1 | 5/2003 | Im et al. |
| 2003/0104682 A1 | 6/2003 | Hara |
| 2003/0119286 A1 | 6/2003 | Im et al. |
| 2003/0148565 A1 | 8/2003 | Yamanaka |
| 2003/0148594 A1 | 8/2003 | Yamazaki et al. |
| 2003/0171837 A1* | 9/2003 | Yamazaki et al. ............ 700/121 |
| 2003/0183270 A1 | 10/2003 | Falk et al. |
| 2003/0194613 A1 | 10/2003 | Voutsas et al. |
| 2003/0196589 A1 | 10/2003 | Mitani et al. |
| 2003/0218171 A1 | 11/2003 | Isobe et al. |
| 2004/0041158 A1 | 3/2004 | Hongo et al. |
| 2004/0053450 A1 | 3/2004 | Sposili et al. |
| 2004/0061843 A1 | 4/2004 | Im |
| 2004/0127066 A1 | 7/2004 | Jung |
| 2004/0140470 A1 | 7/2004 | Kawasaki et al. |
| 2004/0169176 A1 | 9/2004 | Peterson et al. |
| 2004/0182838 A1 | 9/2004 | Das et al. |
| 2004/0209447 A1 | 10/2004 | Gosain et al. |
| 2004/0222187 A1 | 11/2004 | Lin |
| 2004/0224487 A1* | 11/2004 | Yang ............................. 438/487 |
| 2005/0003591 A1 | 1/2005 | Takaoka et al. |
| 2005/0032249 A1 | 2/2005 | Im et al. |
| 2005/0034653 A1 | 2/2005 | Im et al. |
| 2005/0059222 A1 | 3/2005 | You |
| 2005/0059224 A1 | 3/2005 | Im |
| 2005/0059265 A1 | 3/2005 | Im |
| 2005/0112906 A1 | 5/2005 | Maekawa et al. |
| 2005/0139830 A1 | 6/2005 | Takeda et al. |
| 2005/0141580 A1 | 6/2005 | Partlo et al. |
| 2005/0142450 A1 | 6/2005 | Jung |
| 2005/0142451 A1 | 6/2005 | You |
| 2005/0202654 A1 | 9/2005 | Im |
| 2005/0235903 A1 | 10/2005 | Im et al. |
| 2005/0236908 A1 | 10/2005 | Rivin |
| 2005/0255640 A1 | 11/2005 | Im et al. |
| 2006/0030164 A1 | 2/2006 | Im |
| 2006/0035478 A1 | 2/2006 | You |
| 2006/0040512 A1 | 2/2006 | Im |
| 2006/0060130 A1 | 3/2006 | Im |
| 2006/0102901 A1 | 5/2006 | Im et al. |
| 2006/0125741 A1 | 6/2006 | Tanaka et al. |
| 2006/0134890 A1 | 6/2006 | Im |
| 2006/0211183 A1 | 9/2006 | Duan et al. |
| 2006/0254500 A1 | 11/2006 | Im et al. |
| 2007/0007242 A1 | 1/2007 | Im |
| 2007/0010074 A1 | 1/2007 | Im |
| 2007/0010104 A1 | 1/2007 | Im |
| 2007/0012664 A1 | 1/2007 | Im |
| 2007/0020942 A1 | 1/2007 | Im |
| 2007/0032096 A1 | 2/2007 | Im |
| 2007/0051302 A1 | 3/2007 | Gosain et al. |
| 2007/0054477 A1 | 3/2007 | Kim et al. |
| 2007/0108472 A1 | 5/2007 | Jeong et al. |
| 2007/0111349 A1 | 5/2007 | Im |
| 2007/0145017 A1 | 6/2007 | Im et al. |
| 2007/0184638 A1 | 8/2007 | Kang et al. |
| 2007/0215877 A1 | 9/2007 | Kato et al. |
| 2007/0215942 A1 | 9/2007 | Chen et al. |
| 2008/0035863 A1 | 2/2008 | Im et al. |
| 2008/0124526 A1 | 5/2008 | Im |
| 2008/0176414 A1 | 7/2008 | Im |
| 2009/0137105 A1 | 5/2009 | Im |
| 2009/0242805 A1 | 10/2009 | Im |
| 2009/0309104 A1 | 12/2009 | Im et al. |
| 2010/0024865 A1 | 2/2010 | Shah et al. |

FOREIGN PATENT DOCUMENTS

| | | |
|---|---|---|
| DE | 19839718 | 3/2000 |
| DE | 10103 670 A1 | 8/2002 |
| EP | 655774 A2 | 5/1995 |
| EP | 681316 A2 | 11/1995 |
| EP | 1067593 A2 | 1/2001 |
| GB | 2338342 A | 12/1999 |
| GB | 2338343 A | 12/1999 |
| GB | 2338597 A | 12/1999 |
| JP | S57-027035 | 2/1982 |
| JP | 62160781 | 7/1987 |
| JP | 62181419 A | 8/1987 |
| JP | 62216320 | 9/1987 |
| JP | H01-256114 | 10/1989 |
| JP | 2081422 | 3/1990 |
| JP | 2283036 A | 11/1990 |
| JP | 04033327 A | 2/1992 |
| JP | 04-279064 | 10/1992 |
| JP | 5041519 A | 2/1993 |
| JP | 5048190 | 2/1993 |
| JP | 06-011729 | 1/1994 |
| JP | 6252048 A | 9/1994 |
| JP | H06-260502 | 9/1994 |
| JP | 6283422 A | 10/1994 |
| JP | 7176757 A | 7/1995 |
| JP | H08-078330 | 3/1996 |
| JP | H09-007968 | 1/1997 |
| JP | 9171971 A | 6/1997 |
| JP | H09-270393 | 9/1997 |
| JP | 9260681 A | 10/1997 |
| JP | 9321210 A | 12/1997 |
| JP | 10189998 | 7/1998 |
| JP | H10-244390 | 9/1998 |
| JP | 11025064 A | 1/1999 |
| JP | 11064883 A | 3/1999 |
| JP | 11-281997 | 10/1999 |
| JP | H11-297852 | 10/1999 |
| JP | 11330000 A | 11/1999 |
| JP | 2000505241 A | 4/2000 |

(56) References Cited

FOREIGN PATENT DOCUMENTS

| | | |
|---|---|---|
| JP | 2000-315652 | 11/2000 |
| JP | 2000346618 | 12/2000 |
| JP | 2001023920 A | 1/2001 |
| JP | 2000223425 | 8/2002 |
| JP | 2002-353142 | 12/2002 |
| JP | 2002353159 A | 12/2002 |
| JP | 2003-031496 | 1/2003 |
| JP | 2004031809 | 1/2003 |
| JP | 2003-509844 | 3/2003 |
| JP | 20003100653 | 4/2003 |
| JP | 2004-311935 | 11/2004 |
| TW | 457553 B | 10/2001 |
| TW | 464960 A1 | 11/2001 |
| TW | 469539 | 12/2001 |
| TW | 564465 A | 12/2003 |
| TW | 569350 B | 1/2004 |
| TW | I223858 | 11/2004 |
| WO | WO-97/45827 | 12/1997 |
| WO | WO-98/24118 | 6/1998 |
| WO | WO-99/31719 | 6/1999 |
| WO | WO-00/14784 | 3/2000 |
| WO | WO-01/18854 | 3/2001 |
| WO | WO-01/18855 | 3/2001 |
| WO | WO-01/71786 | 9/2001 |
| WO | WO-01/71791 | 9/2001 |
| WO | WO-01/73769 A1 | 10/2001 |
| WO | WO-02/31869 | 4/2002 |
| WO | WO-02/42847 | 5/2002 |
| WO | WO-02/086954 A1 | 10/2002 |
| WO | WO-02/086955 | 10/2002 |
| WO | WO-03/018882 | 3/2003 |
| WO | WO-03/046965 | 6/2003 |
| WO | WO-03/084688 | 10/2003 |
| WO | WO-2004/017380 | 2/2004 |
| WO | WO-2004/017381 | 2/2004 |
| WO | WO-2004/017382 A3 | 4/2004 |
| WO | WO-2004/075263 A3 | 1/2005 |
| WO | WO-2005/029551 | 3/2005 |
| WO | WO-2005/029551 A2 | 3/2005 |
| WO | WO-2005/054949 A2 | 6/2005 |
| WO | WO-2005/029550 A3 | 9/2005 |
| WO | WO-2004/017379 A3 | 12/2005 |
| WO | WO-2006/055003 A1 | 5/2006 |
| WO | WO-2005/029548 A3 | 4/2009 |
| WO | WO-2005/029546 A3 | 6/2009 |

OTHER PUBLICATIONS

Biegelsen, D.K., L.E. Fennell and J.C. Zesch, Origin of oriented crystal growth of radiantly melted silicon on SiO/sub 2, Appl. Phys. Lett. 45, 546-548 (1984).
Boyd, I. W., "Laser Processing of Thin Films and Microstructures, Oxidation, Deposition and Etching of Insulators," (Springer-Verlag Berlin Heidelber, 1987.
Broadbent et al., "Excimer Laser Processing of Al-1%Cu/TiW Interconnect Layers," Proceedings, Sixth International IEEE VLSI Multilevel Interconnection Conference, Santa Clara, CA, Jun. 12-13, pp. 336-345 (1989).
Brotherton et al., "Influence of Melt Depth in Laser Crystallized Poly-Si Thin Film Transistors," Journal of Appl. Phys., 82:4086-4094 (1997).
Brotherton, "Polycrystalline Silicon Thin Film Transistors," Semicond. Sci. Tech., 10:721-738 (1995).
Brotherton, S.D., et al., Characterisation of poly-Si TFTs in Directionally Solidified SLS Si, Asia Display/IDW'01, p. 387-390.
International Search Report and Written Opinion issued for International Patent Application No. PCT/US2006/012435.
Crowder et al., "Low-Temperature Single-Crystal Si TFT's Fabricated on Si Films Processed via Sequential Lateral Solidification," IEEE Electron Device Letter, 19 (8): 306-308 (1998).
Crowder et al., "Parametric Investigation of SLS-processed Polysilicon Thin Films for TFT Applications," Preparations and Characterization, Elsevier, Sequoia, NL, vol. 427, No. 1-2, Mar. 3, 2003, pp. 101-107, XP004417451.
Crowder et al., "Sequential Lateral Solidification of PECVD and Sputter Deposited a-Si Films", Mat. Res. Soc. Symp. Proc. 621:Q.9.7.1-9.7.6, 2000.
Dassow, R. et al. Laser-Crystallized Polycrystalline Silicon on Glass for Photovoltaic Applications, Solid State Phenomena, pp. 193-198, vols. 67-68, Scitec Publications, Switzerland. (1999).
Dassow, R. et al. Nd:YVO4 Laser Crystallization for Thin Film Transistors with a High Mobility, Mat. Res. Soc. Symp. Proc., 2000, Q9.3.1-Q9.3.6, vol. 621, Materials Research Society.
Dassow, R. et al., Laser crystallization of silicon for high-performance thin-film transistors, Semicond. Sci. Technol., 2000, pp. L31-L34, vol. 15, UK.
Dimitriadis, C.A., J. Stoemenos, P.A. Coxon, S. Friligkos, J. Antonopoulos and N.A. Economou, Effect of pressure on the growth of crystallites of low-pressure chemical-vapor-deposited polycrystalline silicon films and the effective electron mobility under high normal field in thin-film transistors, J. Appl. Phys. 73, 8402 (1993).
Endert et al., "Excimer Laser: A New Tool for Precision Micromachining," Optical and Quantum Electronics, 27:1319-1335 (1995).
Fogarassy et al., "Pulsed Laser Crystallization of Hydrogen-Free a-Si Thin Films for High-Mobility Poly-Si TFT Fabrication," Applied Physics A—Solids and Surfaces, 56:365-373 (1993).
Geis et al., "Crystallographic orientation of silicon on an amorphous substrate using an artificial surface-relief grating and laser crystallization," Appl. Phys. Lett. 35(1) Jul. 1, 1979, 71-74.
Geis et al., "Silicon graphoepitaxy using a strip-heater oven," Appl. Phys. Lett. 37(5), Sep. 1, 1980, 454-456.
Geis et al., "Zone-Melting recrystallization of Si Films with a moveable-strip heater oven," J. Electro-Chem. Soc., 129: 2812-2818 (1982).
Gosain et al., "Formation of (100)-Textured Si Film Using an Excimer Laser on a Glass Substrate," Jpn. J. Appl. Phys., vol. 42 (2003) pp. L135-L137.
Gupta et al., "Numerical Analysis of Excimer-laser induced melting and solidification of Si Thin Films", Applied Phys. Lett., 71:99-101, 1997.
Hau-Riege et al., "The Effects Microstructural Transitions at Width Transitions on interconnect reliability," Journal of Applied Physics, 87(12): 8467-8472 (Jun. 15, 2000).
Hawkins, W.G. et al., "Origin of lamellae in radiatively melted silicon films," Appl. Phys. Lett. 42(4), pp. 358-360, Feb. 15, 1983.
Hayzelden, C. and J.L. Batstone, Silicide formation and silicide-mediated crystallization of nickel-implanted amorphous silicon thin films, J. Appl. Phys. 73, 8279-8289 (1993).
Im et al., "Controlled Super-Lateral Growth of Si Films for Microstructural Manipulation and Optimization," Phys. Stat. Sol. (a), 166:603-617 (1998).
Im et al., "Crystalline Si Films for Integrated Active-Matrix Liquid-Crystals Displays," MRS Bulletin, 21:39-48 (1996).
Im et al., "On the Super Lateral Growth Phenomenon Observed in Excimer Laser-Induced Crystallization of Thin Si Films," Appl. Phys. Lett., 64 (17): 2303-2305 (1994).
Im et al., "Phase Transformation Mechanisms Involved in Excimer Laser Crystallization of Amorphous Silicon Films," Appl. Phys. Lett., 63 (14): 1969-1971 (1993).
Im et al., "Single-Crystal Si Films for Thin-Film Transistor Devices," Appl. Phys. Lett., 70(25): 3434-3436 (1997).
Im, J.S., Method and system for producing crystalline thin films with a uniform crystalline orientation, U.S. Appl. No. 60/503,419; ref. file # 36013(BB); Columbia ref. M02-063, 2003.
Ishida et al., "Ultra-shallow boxlike profiles fabricated by pulsed ultraviolet-laser doping process," J. Vac. Sci. Technol. B 12(1): 399-403, (1994).
Ishihara et al., "A Novel Double-Pulse Excimer-Laser Crystallization Method of Silicon Thin-Films," Publication Office, Japanese Journal of Applied Physics, Tokyo, Japan, 34(8A): 3976-3981 (1995).
Jeon et al., "New Excimer Laser Recrystalization of Poly-Si for Effective Grain Growth and Grain Boundary Arrangement," Jpn. J. Appl. Phys. vol. 39 (2000) pp. 2012-2014, Part 1, No. 4B, Apr. 2000.

(56) References Cited

OTHER PUBLICATIONS

Jeon et al., "Two-step laser recrystallization of poly-Si for effective control of grain boundaries," Journal of Non Crystalline Solids, 266-269: 645-649 (2000).
Jung, Y.H., et al., Low Temperature Polycrystalline Si TFTs Fabricated with Directionally Crystallized Si Film, Mat. Res. Soc. Symp. Proc. vol. 621, Z8.3.1-6, 2000.
Jung, Y.H., et al., The Dependence of Poly-Si TFT Characteristics on the Relative Misorientation Between Grain Boundaries and the Active Channel, Mat. Res. Soc. Symp. Proc. vol. 621, Q9.14.1-6, 2000.
Kahlert, H., "Creating Crystals," OE Magazine, Nov. 2001, 33-35.
Kim et al., "Grain Boundary Location-Controlled Poly-Si Films for TFT Devices Obtained Via Novel Excimer Laser Process," Mat. Res. Soc. Symp. Proc., vol. 358,pp. 903-908 (1995).
Kim et al., "Multiple Pulse Irradiation Effects in Excimer Laser-Induced Crystallization of Amorphous Si Films," Mat. Res. Soc. Sym. Proc., 321:665-670 (1994).
Kim, C. et al., Development of SLS-Based SOG Display, IDMC 2005, Thu-15-02, 252-255.
Kim, "Excimer-Laser-Induced Crystallization of Amorphous Silicon Thin Films," Ph. D. Dissertation Abstract, Columbia University, 1996.
Kim, H. J. et al., "Excimer Laser Induced Crystallization of Thin Amorphous Si Films on SiO2: Implications of Crystallized Microstructures for Phase Transformation Mechanisms," Mat. Res. Soc. Symp. Proc., vol. 283, 1993.
Kim, H.-J., et al., "The effects of dopants on surface-energy-driven secondary grain growth in silicon films," J. Appl. Phys. 67 (2), pp. 757-767 (Jan. 15, 1990).
Kim, H.J. et al., "New Excimer-laser-crystallization method for producing large-grained and grain boundary-location-controlled Si Films for Thin Film Transistors", Applied Phys. Lett., 68: 1513, 1996.
Kimura, M. and K. Egami, Influence of as-deposited film structure on (100) texture in laser-recrystallized silicon on fused quartz, Appl. Phys. Lett. 44, 420-422 (1984).
Knowles, D.S. et al., "P-59: Thin Beam Crystallization Method: a New Laser Annealing Tool with Lower Cost and Higher Yield for LTPS Panels," SID 00 Digest, pp. 1-3.
Kohler, J.R. et al., Large-grained polycrystalline silicon on glass by copper vapor laser annealing. Thin Solid Films, 1999, pp. 129-132, vol. 337, Elsevier.
Kung, K.T.Y. and R. Reif, Implant-dose dependence of grain size and (110) texture enhancements in polycrystalline Si films by seed selection through ion channeling, J. Appl. Phys. 59, 2422-2428 (1986).
Kung, K.T.Y., R.B. Iverson and R. Reif, Seed selection through ion channeling to modify crystallographic orientations of polycrystalline Si films on SiO/sub 2/:Implant angle dependence, Appl. Phys. Lett. 46, 683-685 (1985).
Kuriyama, H., T. Nohda, S. Ishida, T. Kuwahara, S. Noguchi, S. Kiyama, S. Tsuda and S. Nakano, Lateral grain growth of poly-Si films with a specific orientation by an excimer laser annealing method, Jpn. J. Appl. Phys. 32, 6190-6195 (1993).
Kuriyama, H., T. Nohda, Y. Aya, T. Kuwahara, K. Wakisaka, S. Kiyama and S. Tsuda, Comprehensive study of lateral grain growth in poly-Si films by excimer laser annealing and its application to thin film transistors, Jpn. J. Appl. Phys. 33, 5657-5662 (1994).
Lee, S.-W. and S.-K. Joo, Low temperature poly-Si thin-film transistor fabrication by metal-induced lateral crystallization, IEEE Electron Device Letters 17, 160-162 (1996).
Lee, S.-W., Y.-C. Jeon and S.-K. Joo, Pd induced lateral crystallization of amorphous Si thin films, Appl. Phys. Lett. 66, 1671-1673 (1995).
Leonard, J.P. et al, "Stochastic modeling of solid nucleation in supercooled liquids", Appl. Phys. Lett. 78:22, May 28, 2001, 3454-3456.
Limanov, A. et al., Single-Axis Projection Scheme for Conducting Sequential Lateral Solidification of Si Films for Large-Area Electronics, Mat. Res. Soc. Symp. Proc., 2001, D10.1.1-D10.1.7, vol. 685E, Materials Research Society.
Limanov, A. et al., The Study of Silicon Films Obtained by Sequential Lateral Solidification by Means of a 3-k-Hz Excimer Laser with a Sheetlike Beam, Russian Microelectronics, 1999, pp. 30-39, vol. 28, No. 1, Russia.
Limanov, A.B., et al., Development of Linear Sequential Lateral Solidification Technique to Fabricate Quasi-Single-Cyrstal Superthin Si Films for High-Performance Thin Film Transistor Devices, Perspectives, Science, and Technologies for Novel Silicon on Insulator Devices, Eds. P.L.F. Hemment et al., Kluwer Academic Publishers, pp. 55-61, 2000.
Mariucci et al., "Grain boundary location control by patterned metal film in excimer laser crystallized polysilicon," Proceedings of the Fifth International Conference on Polycrystalline Semiconductors, Schwabisch Gmund, Germany, 67-68: 175-180 (1998).
McWilliams et al., "Wafer-Scale Laser Pantography: Fabrication of N-Metal-Oxide-Semiconductor Transistors and Small-Scale Integrated Circuits by Direct-Write Laser-Induced Pyrolytic Reactions," Applied Physics Letters, American Institute of Physics, New York, US, 43(10): 946-948 (1983).
Micro/Las Lasersystem GMBH, "Overview of Beam Delivery Systems for Excimer Lasers," (1999). 20 pages.
Micro/Las Lasersystem GMBH, "UV Optics Systems for Excimer Laser Based Micromachining and Marking," (1999). 11 pages.
Miyasaka, M., K. Makihira, T. Asano, E. Polychroniadis and J. Stoemenos, In situ observation of nickel metal-induced lateral crystallization of amorphous silicon thin films, Appl. Phys. Lett. 80, 944-946 (2002).
Miyata et al, "Low-Temperature Polycrystalline Silicon Thin-Film Transistors for Large-Area Liquid Crystal Display," Japanese J. of Applied Physics, Part 1—Regular Papers Short Notes & Review Papers, 31:4559-62 (1992).
Nebel, "Laser Interference Structuring of A-Sl:h" Amorphous Silicon Technology—1996, San Francisco, CA Apr. 8-12, Materials Research Society Symposium Proceedings, vol. 420, Pittsburgh, PA, pp. 117-128 (1996).
Nerding, M., S. Christiansen, R. Dassow, K. Taretto, J.R. Kohler and H.P. Strunk, Tailoring texture in laser crystallization of silicon thin-films on glass, Solid State Phenom. 93, 173 (2003).
Noguchi, "Appearance of Single-Crystalline Properties in Fine-Patterned Si Thin Film Transistors (TFTs) by Solid Phase Crystallization (SPC)," Jpn. J. Appl. Phys., 32:L1584-L1587 (1993).
Ozawa et al., "Two-Dimensionally Position-Controlled Excimer-Laser-Crystallization of Silicon Thin Films on Glassy Substrate," Jpn. J. Appl. Phys. 38(10):5700-5705 (1999).
Park, J. et al., "Thin Laser Beam Crystallization method for SOP and OLED application," SID 2005, pp. 1-5.
Sato et al., "Mobility anisotropy of electrons in inversion layers on oxidized silicon surfaces," Physical Review B (State) 4, 1950 (1971).
Smith, H.I. et al, "The Mechanism of Orientation in Si Graphoepitaxy by Laser Strip Heater Recrystallization," J. Electrochem. Soc.: Solid-State Science and Technology, vol. 130, No. 10, Oct. 1983, pp. 2050-2053.
Song et al., "Single Crystal Si Islands on SiO2 Obtained Via Excimer Laser Irradiation of a Patterned Si Film", Applied Phys. Lett., 68:3165, 1996.
Sposili et al., "Line-scan sequential lateral solidification of Si thin films", Appl. Phys. A67, 273-6, 1998.
Sposili et al., "Sequential Lateral Solidification of Thin Silicon Films on SiO2," Appl. Phys. Lett., 69(19): 2864 (1996).
Sposili et al., "Single-Crystal Si Films via a Low-Substrate-Temperature Excimer-Laser Crystallization Method," Mat. Res. Soc. Symp. Proc., 452: 953-958 (1997).
Thompson, C.V. and H.I. Smith, Surface-energy-driven secondary grain growth in ultrathin (<100 nm) films of silicon, Appl. Phys. Lett. 44, 603 (1984).
Van Der Wilt, P.C. and B.A. Turk, unpublished EBSD results on directional SLS.
van der Wilt, P.C. et al., "State-of-the-Art Laser Crystallization of Si for Flat Panel Displays," PhAST, May 18, 2004, pp. 1-34.
van der Wilt, P.C. et al., "The Commercialization of the SLS Technology," Taiwan FPD, Jun. 11, 2004, pp. 1-12.
van der Wilt, P.C., "Textured poly-Si films for hybrid SLS," Jul. 2004, pp. 1-5.

(56) References Cited

OTHER PUBLICATIONS

Voutsas, "Assessment of the Performance of Laser-Based Lateral-Crystallization Technology via Analysis and Modeling of Polysilicon Thin-Film-Transistor Mobility," IEEE Transactions on Electron Devices, 50(6):1494-1500 (Jun. 2003).

Voutsas, A.T., A new era of crystallization: advances in polysilicon crystallization and crystal engineering, Applied Surface Science 250-262, 2003.

Voutsas, A.T., et al., Effect of process parameters on the structural characteristics of laterally grown, laser-annealed polycrystalline silicon films, Journal of Applied Physics, vol. 94, No. 12, p. 7445-7452, Dec. 15, 2003.

Watanabe et al., "Crystallization Process of Polycrystalline Silicon by KrF Excimer Laser Annealing," Japanese J. of Applied Physics, Part 1—Regular Papers Short Notes & Review Papers, 33:4491-98 (1994).

Weiner, K. H. et al. "Laser-assisted, Self-aligned Silicide Formation," A Verdant Technologies technical brief, Aug. 7, 1997, 1-9.

Weiner, K. H. et al., "Ultrashallow Junction Formation Using Projection Gas Immersion Laser Doping (PGILD)," A Verdant Technologies Technical Brief, Aug. 20, 1997.

Werner, J.H., et al. From polycrystalline to single crystalline silicon on glass, Thin Solid Films 383, 95-100, 2001.

White et al., "Characterization of thin-oxide MNOS memory transistors," IEEE Trans. Electron Devices ED-19, 1280 (1972).

Yamamuchi et al., "Polycrystalline silicon thin films processed with silicon ion implantation and subsequent solid-phase crystallization: Theory, experiments, and thin-film transistor applications," Journal of Applied Physics, 75(7):3235-3257 (1994).

Yoshimoto et al., "Excimer-Laser-Produced and Two-Dimensionally Position-Controlled Giant Si Grains on Organic SOG Underlayer," p. 285-286, AM-LCD (2000).

International Search Report and Written Opinion for corresponding International Patent Application No. PCT/US2010/033565, mailed Jul. 1, 2010, 1 page.

International Search Report and Written Opinion for corresponding International Patent Application No. PCT/US2010/055106, mailed Jan. 4, 2011, 1 page.

Andrä et al., "A new technology for crystalline silicon thin film solar cells on glass based on the laser crystallization," IEEE, pp. 217-220 (2000).

Andrä et al., "Multicrystalline LLC-SI thin film solar cells on low temperature glass," Poster, 3rd world Conference on Photovoltaic Energy Conversion, Osaka, Japan, pp. 1174-1177, May 11-18, 2003.

Sinke et al., "Explosive crystallization of amorphous silicon: Triggering and propagation," Applied Surface Science, vol. 43, pp. 128-135 (1989).

Van Der Wilt, "A hybrid approach for obtaining orientation-controlled single-crystal Si regions on glass substrates," Proc. of SPIE vol. 6106, 61060B-1 to B-15, (2006).

Taiwanese Search Report issued for Taiwanese application No. 095143569, dated Aug. 5, 2013, 1 page.

* cited by examiner

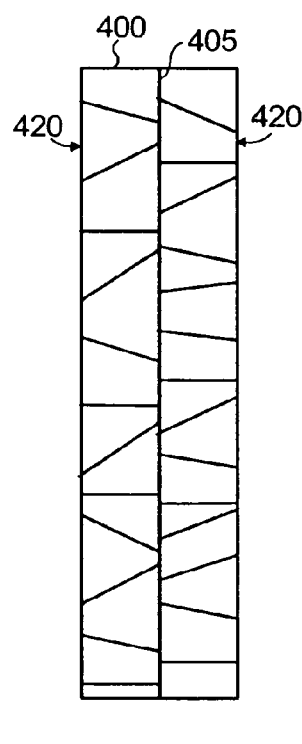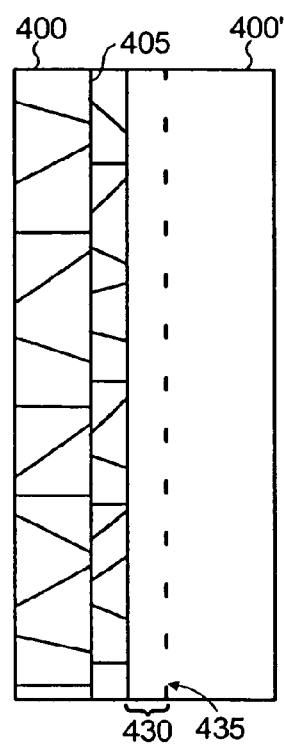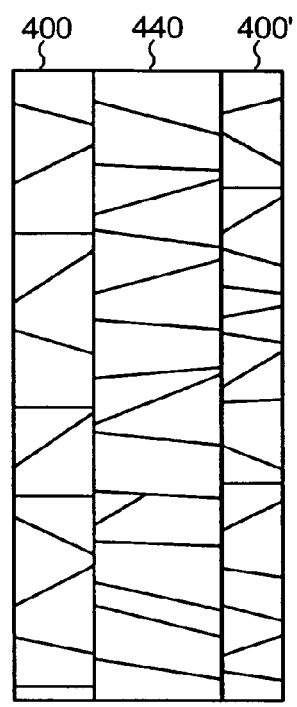
Fig. 4A        Fig. 4B        Fig. 4C

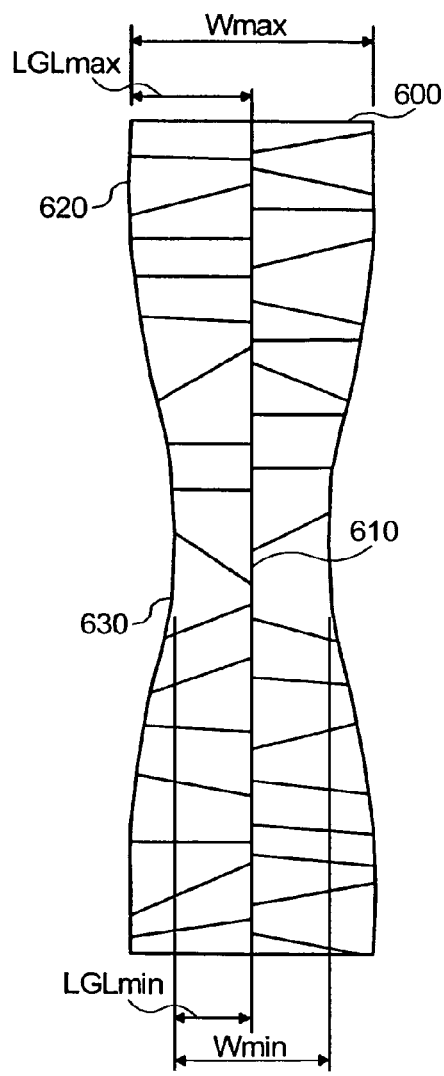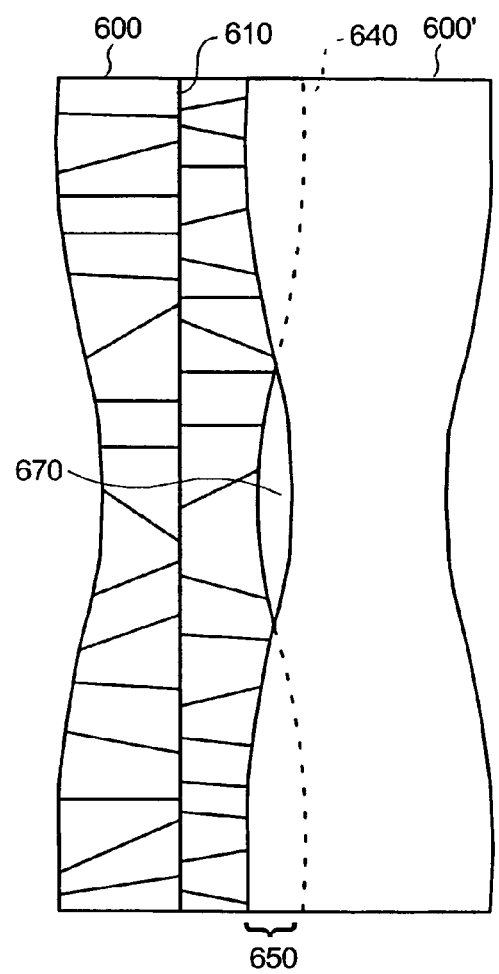
*Fig. 6A*          *Fig. 6B*

LINE SCAN SEQUENTIAL LATERAL SOLIDIFICATION OF THIN FILMS

CROSS REFERENCE TO RELATED APPLICATIONS

This application is a continuation of and claims the benefit under 35 USC §120 of U.S. Pat. No. 8,221,544, issued on Jul. 17, 2012, entitled "Line Scan Sequential Lateral Solidification of Thin Films," which claims the benefit under 35 USC §119(e) of U.S. Provisional Patent Application No. 60/668,934, filed on Apr. 6, 2005, entitled "Line Scan Sequential Lateral Solidification of Thin Films," the contents of which are herein incorporated by reference in their entirety.

FIELD OF THE INVENTION

This invention relates to processing for thin film materials, and more particularly to forming crystalline thin films from amorphous or polycrystalline thin films using a line beam laser irradiation. In particular, the present disclosure relates to systems and methods for processing thin films to obtain substantial performance uniformity of thin film transistors ("TFTs") situated therein.

BACKGROUND OF THE INVENTION

In recent years, various techniques for crystallizing or improving the crystallinity of an amorphous or polycrystalline semiconductor film have been investigated. This technology is used in the manufacture of a variety of devices, such as image sensors and active-matrix liquid crystal display (AM-LCD) devices. A regular array of thin-film transistors (TFTs) is fabricated on an appropriate substrate and each transistor serves as a pixel controller.

Crystalline semiconductor films, such as silicon films, provide pixels for liquid crystal displays. Such films have been processed by irradiation by an excimer laser followed by crystallization in excimer laser annealing ("ELA") processes. Other more advantageous methods and systems, such as sequential lateral solidification ("SLS") techniques, for processing semiconductor thin films for use in liquid crystal displays and organic light emitting diode ("OLED") displays have been described. SLS is a pulsed-laser crystallization process that can produce crystalline films on substrates, including substrates that are intolerant to heat such as glass and plastics.

SLS uses controlled laser pulses to melt a region of an amorphous or polycrystalline thin film on a substrate. The melted region of film then laterally crystallizes into a directionally solidified lateral columnar microstructure or a location-controlled large single crystal region. Generally the melt/crystallization process is sequentially repeated over the surface of a large thin film large, with a large number of laser pulses. The processed film on substrate is then used to produce either one display, or even divided to produce multiple displays.

However, conventional ELA and SLS techniques are limited by variation in the laser pulses from one shot to the next. Each laser pulse used to melt a region of film typically has a different energy fluence than other laser pulses used to melt other regions of film. In turn, this can cause slightly different performance in the regions of recrystallized film across the area of the display. For example, during the sequential irradiation of neighboring regions of the thin film, a first region is irradiated by a first laser pulse having a first energy fluence; a second region is irradiated by a second laser pulse having a second fluence which is at least slightly different from that of the first laser pulse; and a third region is irradiated by a third laser pulse having a third fluence that is at least slightly different from that of the first and second laser pulses. The resulting energy densities of the irradiated and crystallized first, second and third regions of the semiconductor film are all, at least to some extent, different from one another due to the varying fluences of the sequential beam pulses irradiating neighboring regions Variations in the fluence and/or energy density of the laser pulses, which melt regions of film, can cause variations in the quality and performance of the crystallized regions. When thin film transistor ("TFT") devices are subsequently fabricated in such areas that have been irradiated and crystallized by laser beam pulses of different energy fluences and/or energy densities, performance differences may be detected. This may manifest itself in that the same colors provided on neighboring pixels of the display may appear different from one another. Another consequence of non-uniform irradiation of neighboring regions of the thin film is that a transition between pixels in one of these regions to pixels in the next consecutive region may be visible in the display produced from the film. This is due to the energy densities being different from one another in the two neighboring regions so that the transition between the regions at their borders has a contrast from one to the other.

SUMMARY OF THE INVENTION

Semiconductor film substrates are crystallized in a process that reduces the effect of differing energy fluences and energy densities of consecutive beam pulses on neighboring regions of a semiconductor film. The reduced effect provides films that can be used LCD and OLED displays that have greater uniformity and reduced sharpness in transition from adjacent crystallized regions.

In one aspect, a method of preparing a polycrystalline film includes (a) providing a substrate having a thin film disposed thereon, said film capable of laser-induced melting; (b) generating a sequence of laser pulses having a fluence that is sufficient to melt the film throughout its thickness in an irradiated region, each pulse forming a line beam having a length and width, said width sufficient to substantially prevent nucleation of solids in a portion of the thin film that is irradiated by the laser pulse; (c) irradiating a first region of the film with a first laser pulse to form a first molten zone, said first molten zone demonstrating a variation in width along its length to thereby define a maximum width ($W_{max}$) and a minimum width ($W_{min}$), wherein $W_{max}$ is less than $2W_{min}$, and wherein the first molten zone crystallizes upon cooling to form one or more laterally grown crystals; (d) laterally moving the film in the direction of lateral growth a distance that is greater than about one-half $W_{max}$ and less than $W_{min}$; and (e) irradiating a second region of the film with a second laser pulse to form a second molten zone having a shape that is substantially the same as the shape of the first molten zone, wherein the second molten zone crystallizes upon cooling to form one or more laterally grown crystals that are elongations of the one or more crystals in the first region. In one or more embodiments, a width that is "sufficient to substantially prevent nucleation" is less than or equal to about twice the characteristic lateral growth length of the film under irradiation conditions.

In one or more embodiments, $W_{max}$ is less than about 7 µm, or less than about 10 µm. The width of the molten zone varies by greater than 10% along its length, or varies up to 50% along its length. The length of the molten zone is in a range of about 10 mm to about 1000 mm.

In one or more embodiment, the molten zone has a length that is about as large as the width, or the length, of the substrate. In one or more embodiments, the molten zone has a length that is at least as large as one-half the width, or the length, of the substrate.

In one or more embodiments, steps (d) and (e) are repeated for a sufficient number of iterations to crystallize the film across the width, or the length, of the substrate in a single scan.

In another aspect, a method of preparing a polycrystalline film includes (a) providing a substrate having a thin film disposed thereon, said film capable of laser-induced melting; (b) generating a sequence of laser pulses having a fluence that is sufficient to melt the film throughout its thickness in an irradiated region, each pulse forming a line beam having a predetermined length and width; (c) irradiating a first region of the film with a first laser pulse to form a first molten zone, wherein the first molten zone is positioned at an angle relative to an edge of the substrate, and wherein the first molten zone of the film crystallizes upon cooling to form one or more laterally grown crystals; (d) laterally moving the film a distance substantially parallel to the edge of the substrate, said distance selected to provide overlap between the first laser pulse and a second laser pulse; (e) irradiating a second region of the film with a second laser pulse to form a second molten zone having a shape that is substantially the same as the first molten zone, wherein the second molten zone overlaps a portion of the laterally grown crystals of the first region, and wherein the second molten zone of the film crystallizes upon cooling to form one or more laterally grown crystals that are elongations of the one or more crystals in the first region.

In one or more embodiments, the angle is in the range of about 1-5 degrees, or about 1-20 degrees.

In one or more embodiments, the molten zone is positioned at an angle with respect to a position intended for a column of pixels in an active matrix display.

In one or more embodiment, the laterally grown crystals are oriented at an angle with respect to an edge of the substrate.

In one or more embodiment, the laser pulse width is selected to prevent nucleation of solids in a portion of the thin film that is irradiated by the laser pulse.

In one or more embodiment, the method further includes periodically interrupting lateral growth of the laterally grown crystals and initiating growth of a new set of laterally grown crystals. Lateral growth of the crystals is interrupted between about every 10 and 200 laser pulses, or between about every 20 and 400 microns of lateral repositioning of the film.

In another aspect, a method of preparing a polycrystalline film includes (a) providing a substrate having a thin film disposed thereon, said film capable of laser-induced melting; (b) generating a sequence of laser pulses, each pulse forming a line beam having a predetermined length and width and having a fluence that is sufficient to melt the film throughout its thickness in an irradiated region; (c) irradiating a first portion of the film with a plurality of laser pulses, wherein the irradiated film crystallizes after each laser pulse to form one or more laterally grown crystals and wherein the film is laterally moved a first distance relative to the laser pulses in the direction of lateral crystal growth after each laser pulse, to form a first crystalline region; and (d) without interruption of the film movement in the direction of the lateral crystal growth, irradiating a second portion of the film with a plurality of laser pulses, wherein the irradiated film crystallizes after each laser pulse to form one or more laterally grown crystals and wherein the film is laterally moved a second distance relative to the laser pulses in the direction of lateral crystal growth after each laser pulse, to form a second crystalline region, wherein said first distance is different from said second distance.

In one or more embodiments, the film alternates between moving a first translation distance and a second translation distance across regions of the substrate. Either the laser repetition rate or the sample translation speed can be varied to achieve the first and second translation distances.

In one or more embodiment, the first distance is selected to provide columns of laterally grown crystals having location controlled grain boundaries that interrupt lateral crystal growth and are substantially perpendicular to the direction of lateral growth. Each laser pulse forms a molten zone and the first distance is greater than one-half the width of the molten zone and less than the width of the molten zone.

In one or more embodiment, the molten zone demonstrates a variation in width along its length to thereby define a maximum width ($W_{max}$) and a minimum width ($W_{min}$), and the first distance is greater than about one-half $W_{max}$ and less than $W_{min}$.

In one or more embodiment, the second distance is selected to provide laterally grown crystals extending substantially in the direction of film movement. Each laser pulse forms a molten zone and the second distance is less than one-half the width of the molten zone.

In one or more embodiment, each laser pulse forms a molten zone and the first distance is greater than one-half the width of the molten zone and less than the width of the molten zone and the second distance is greater than one-half the width of the molten zone and less than the width of the molten zone.

In one or more embodiments, the first distance is selected to provide a first set of predetermined crystalline properties suitable for a channel region of a pixel TFT and/or the second distance is selected to provide a second set of predetermined crystalline properties suitable for a channel region of an integration TFT and/or the second portion is wide enough to accommodate a pair of integration regions for two adjacent displays.

In one or more embodiments, the line beam is formed by focusing the laser pulses into a shape of a desired dimension, and/or the laser pulse is focused into a line beam using cylindrical optics, and/or the line beam is further shaped using a shaping means selected from the group consisting of a mask, a slit or a straight edge.

In one or more embodiments, the line beam is formed using a shaping means selected from the group consisting of a mask, a slit or a straight edge and the mask defines the width and the length of the line beam or the slit defines the width of the line beam and the length of the line beam is defined by at least one optical element, or the straight edge defines a width of the shaped laser beam. The shaping means can have a length with non-linear features and/or the non-linear features are serrations.

In one or more embodiments, the line beam has a length to width aspect ratio of greater than 50, or a length to width aspect ratio of up to $2 \times 10^5$.

In one or more embodiments, the molten zone has a width that is less than about 5 µm, or less than about 10 µm and/or the length of the molten zone is in a range of about 10 mm to about 1000 mm.

In another aspect, a system for preparing a semiconductor film for an active matrix display includes a laser source providing laser pulses having a pulse frequency of greater than about 4 kHz and having an average power of greater than 300

W; laser optics that shape the laser beam into a line beam, the shaped laser beam having a substantially uniform fluence along the length of the line beam; a stage for support of a sample capable of translation in at least one direction; and memory for storing a set of instructions; the instructions comprising:

(a) irradiating a first region of the film with a first laser pulse to form a first molten zone, said first molten zone demonstrating a variation in width along its length to thereby define a maximum width ($W_{max}$) and a minimum width ($W_{min}$), wherein the first molten zone crystallizes upon cooling to form one or more laterally grown crystals;

(b) laterally moving the film in the direction of lateral growth a distance that is greater than about one-half $W_{max}$ and less than $W_{min}$; and (c) irradiating a second region of the film with a second laser pulse to form a second molten zone having a shape that is substantially the same as the shape of the first molten zone, wherein the second molten zone crystallizes upon cooling to form one or more laterally grown crystals that are elongations of the one or more crystals in the first region, where the system laser optics provide $W_{max}$ less than $2W_{min}$.

In one or more embodiments, the line beam is positioned at an angle relative to a position intended for a column of TFTs, or the line beam is positioned at an angle relative to an edge of the substrate.

In another aspect, a system for preparing a semiconductor film for an active matrix display includes a laser source providing laser pulses having a pulse frequency of greater than about 4 kHz and having an average power of greater than 300 W; laser optics that shape the laser beam into an line beam, the shaped laser beam having a substantially uniform fluence along the length of the line beam; a stage for support of a sample capable of translation in at least one direction; and memory for storing a set of instructions; the instructions comprising:

(a) irradiating a first portion of the film with a plurality of laser pulses, wherein the irradiated film crystallizes after each laser pulse to form one or more laterally grown crystals and wherein the film is laterally moved a first distance in the direction of lateral crystal growth after each laser pulse, to form a first crystalline region having a first set of predetermined crystalline properties; and (b) without interruption of the film movement in the direction of the lateral crystal growth, irradiating a second portion of the film with a plurality of laser pulses, wherein the irradiated film crystallizes after each laser pulse to form one or more laterally grown crystals and wherein the film is laterally moved a second distance in the direction of lateral crystal growth after each laser pulse, to form a second crystalline region having a second set of predetermined crystalline properties, wherein said first distance is different from said second distance.

BRIEF DESCRIPTION OF THE DRAWINGS

The invention is described with reference to the following figures, which are presented for the purpose of illustration only and which are not intended to be limiting of the invention.

FIG. 4A-FIG. 4D illustrate a line beam sequential lateral solidification process to produce uniform crystals according to one or more embodiments of the present invention.

FIG. 6A-6C illustrate a line beam sequential lateral solidification that overshoots the desired stepping distance according to a conventional sequential lateral solidification process.

DETAILED DESCRIPTION OF THE INVENTION

Figure 1:
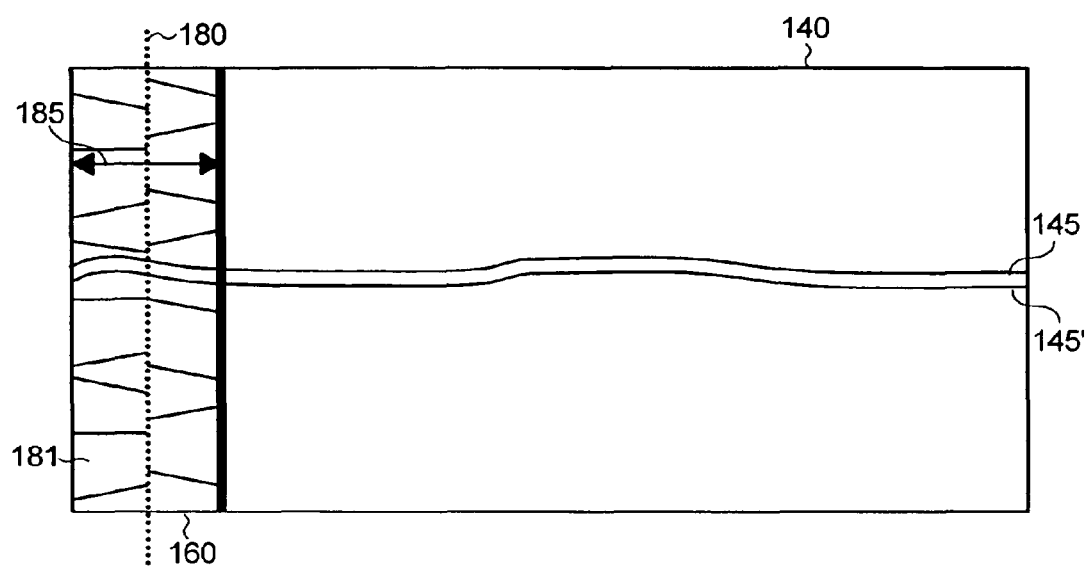
FIG. 1 illustrates a step in a line beam sequential lateral solidification to produce directional crystals according to one or more embodiments of the present invention.

The crystallization of a thin film using a pulsed, narrow, elongated laser beam is described. The crystallization of a region of film following laser-induced melting is related to the characteristics of the laser pulse. In particular, the quality, size and shape of crystal grains in a crystallized region are determined by the energy, the spatial profile, and/or the temporal profile of the laser pulses that melt the region. Various irradiation schemes are described for polycrystalline substrates for use in display devices.

Pulse non-uniformities in an SLS system used to produce crystalline semiconductor films can arise from non-uniformities within a given laser pulse, as well as variations between successive pulses. For example, within a given laser pulse, the spatial energy density profile (e.g., uniformity of irradiation), the temporal intensity profile (e.g., pulse duration and/or temporal shape), and/or the imaging (e.g., field curvature and distortion) may vary. In addition, there are pulse-to-pulse fluctuations in the laser fluence, giving rise to variations in energy densities of sequential laser pulses. Gradual changes of these values within or between pulses can lead to gradual changes in one or more properties of the resulting crystallized region of thin film, for example in the microstructure of the crystallized semiconductor thin film. This can lead to gradual changes in the characteristics of TFT devices prepared on the crystallized film, and therefore gradual changes in brightness between neighboring pixels. In addition, abrupt changes in pixel brightness can be observed when one set of pixels is processed with a laser pulse having different irradiation characteristics than that of another set due to the pulse-to-pulse fluctuations of the laser beam energy.

A pulsed laser system and process of semiconductor thin film crystallization that employs a long, narrow beam can control at least some of the sources of non-uniformities in laser pulses and imaging so that concomitant non-uniformities are not observed in TFT devices prepared on the crystallized thin film. Defects or variation in the quality of the semiconductor film affect TFT device quality, and controlling the nature and the location of these film defects or variations can reduce their impact on the resulting TFT devices.

A conventional SLS system, as for example available from JSW, Japan, uses a two-dimensional (2-D) projection system to generate a rectangular laser pulse with a typical short axis dimension of ~0.5-2.0 mm and a typical long axis dimension 15-30 mm. As these dimensions are not amenable to SLS, which requires at least one dimension to be on the order of the lateral grain growth, e.g., about 2-5 µm, the laser beam is masked to provide a plurality of beamlets of smaller dimension. The absolute changes in intensity etc. of the short axis are less than along the long axis. In addition, there is significant overlap, e.g., ~50% overlap, in the direction of the short axis that helps to average out some of the non-uniformities. Thus, non-uniformities in the short dimension do not contribute greatly to differences in pixel brightness. However, non-uniformities in the long axis are more pronounced, and more detrimental. The long axis may be smaller than the dimension of the display so that it is unavoidable to have abrupt changes in pixel brightness from one scan to another. Furthermore, non-uniformities along the long axis may be on a scale that is very clearly visible to the human eye (e.g., a 10% brightness shift over 1 cm). While the eye is reasonably tolerant to random pixel-to-pixel variations and also to very large-scale (10s of cm) and gradual pixel-to-pixel variations, it is not very tolerant to abrupt changes between regions of a display or to small-scale (mms to cms) gradual fluctuations.

A line beam SLS process uses a one dimensional (1D) projection system to generate a long, highly aspected laser beam, typically on the order of 1-100 cm in length, e.g., a "line beam." The length to width aspect ratio may be in the range of about 50 or more, for example up to 100, or 500, or 1000, or 2000, or 10000, or up to about $2 \times 10^5$, or more for example. In one or more embodiments, width is the average width of $W_{min}$ and $W_{max}$. The length of the beam at its trailing edges may not be well defined in some embodiments of line beam SLS. For example, the energy may fluctuate and slowly drop off at the far ends of the length. The length of the line beam as referred to herein is the length of the line beam having a substantially uniform energy density, e.g., within 5% of the average energy density or fluence along the beam length. Alternatively, the length is the length of the line beam that is of sufficient energy density to perform the melt and solidification steps as described herein.

A thin film that is irradiated by a highly aspected (long) irradiation pattern can be fabricated into TFTs that provide a uniform pixel-to-pixel brightness because a single scan will crystallize an area large enough for the entire display. The beam length is preferably at least about the size of a single display, e.g., a liquid crystal or OLED display, or a multitude thereof or is preferably about the size of a substrate from which multiple displays can be produced. This is useful because it reduces or eliminates the appearance of any boundaries between irradiated regions of film. Any stitching artifacts that may arise when multiple scans across the film are needed, will generally not be visible within a given liquid crystal or OLED display. The beam length can be suitable for preparing substrates for cell phone displays, e.g., ~2 inch diagonal for cell phones and ranging up to 10-16 inch diagonal for laptop displays (with aspect ratios of 2:3, 3:4 or other common ratios).

Crystallization with a long and narrow beam provides advantages when dealing with beams possessing inherent beam non-uniformities. For example, any non-uniformities along the long axis within a given laser pulse will be inherently gradual, and will be obscured over a distance much larger than the eye can detect. By making the long axis length substantially larger than the pixel size, or even larger than the size of the fabricated liquid crystal or OLED display, abrupt changes at the edge of a laser scan may not be apparent within a given fabricated display.

Crystallization with a long and narrow beam will additionally reduce the effect of any non-uniformities in the short axis, because each individual TFT device in the display lies within an area that may be crystallized with at least a few pulses. In other words, the scale of non-uniformity along the short axis is on a scale smaller than that of a single TFT device and therefore will not cause variations in pixel brightness. In addition, pulse-to-pulse fluctuations will become less relevant in the same way as in a conventional 2D SLS system.

An exemplary method using a line beam for SLS processing of a thin film is described with reference to FIG. 1 through FIG. 3. FIG. 1 shows a region 140 of a semiconductor film, e.g., an amorphous silicon film prior to "directional" crystallization, and an irradiating laser pulse in rectangular region 160. The laser pulse melts the film in region 160. The width of the melted region is referred to as the molten zone width (MZW). It should be noted that the laser irradiation region 160 is not drawn to scale in FIG. 1, and that the length of the region is much greater than the width, as is indicated by lines 145, 145'. This allows for a very long region of the film to be irradiated, for example, which is as long or longer than the length of a display that can be produced from the film. In some embodiments, the length of the laser irradiation region substantially spans several devices or even the width or length of the substrate. Using the appropriate laser source and optics, it is possible to generate a laser beam that is 1000 mm long, e.g., the dimension of a Gen 5 substrate, or even longer. In comparison, regions of film irradiated in earlier SLS techniques were on the order of or even smaller than the size of individual TFT devices of the display. In general, the width of the beam is sufficiently narrow that the fluence of laser irradiation is high enough to completely melt the irradiated region. In some embodiments, the width of the beam is sufficiently narrow to avoid nucleation in the crystals that subsequently grow in the melted region. The laser irradiation pattern, e.g., the image defined by the laser pulse, is spatially shaped using techniques described herein. For example, the pulse may be shaped by a mask or a slit. Alternatively, the pulse may be shaped using focusing optics.

After laser irradiation, the melted film begins to crystallize at the solid boundaries of region 160, and continues to crystallize inward towards centerline 180, forming crystals such as exemplary crystal 181. The distance the crystals grow, which is also referred to as the characteristic lateral growth length (characteristic "LGL"), is a function of the film composition, film thickness, the substrate temperature, the laser pulse characteristics, the buffer layer material, if any, and the mask configuration, etc., and can be defined as the LGL that occurs when growth is limited only by the occurrence of nucleation of solids in the supercooled liquid. For example, a typical characteristic lateral growth length for 50 nm thick silicon films is approximately 1-5 µm or about 2.5 µm. When growth is limited by other laterally growing fronts, as is the case here, where two fronts approach centerline 180, the LGL may be less than the characteristic LGL. In that case, the LGL is typically approximately one half the width of the molten zone.

The lateral crystallization results in "location-controlled growth" of grain boundaries and elongated crystals of a desired crystallographic orientation. Location-controlled growth referred to herein is defined as the controlled location of grains and grain boundaries using particular beam irradiation steps.

After the region 160 is irradiated and subsequently laterally crystallized, the silicon film can be advanced in the direction of crystal growth by a distance that is less than the lateral crystal growth length, e.g., not more than 90% of the lateral growth length. A subsequent laser pulse is then directed at a new area of the silicon film. For the fabrication of "directional" crystals, e.g., crystals having significant extension along a specific axis, the subsequent pulse preferably substantially overlaps with an area that has already been crystallized. By advancing the film a small distance, the crystals produced by earlier laser pulses act as seed crystals for subsequent crystallization of adjacent material. By repeating the process of advancing the film by small steps, and irradiating the film with a laser pulse at each step, crystals are made to grow laterally across the film, in the direction of the movement of the film relative to the laser pulse.

Figure 2:
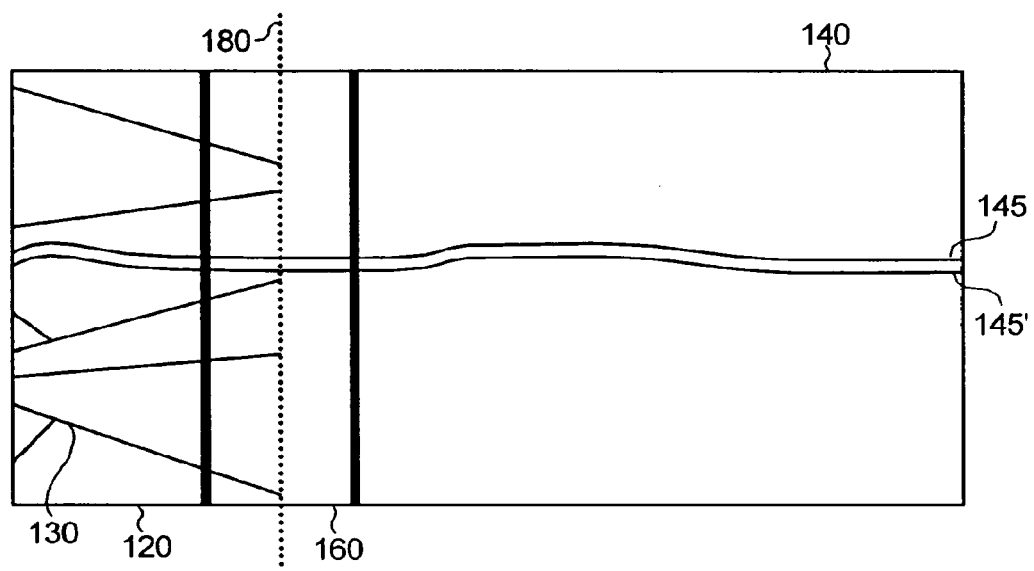
FIG. 2 illustrates a step in a line beam sequential lateral solidification to produce directional crystals according to one or more embodiments of the present invention.

FIG. 2 shows the region 140 of the film after several iterations of moving the film and irradiating with laser pulses. As is clearly shown, an area 120 that has been irradiated by several pulses has formed elongated crystals that have grown in a direction substantially perpendicular to the length of the irradiation pattern. Substantially perpendicular means that a majority of lines formed by crystal boundaries 130 could be extended to intersect with dashed centerline 180.

Figure 3:
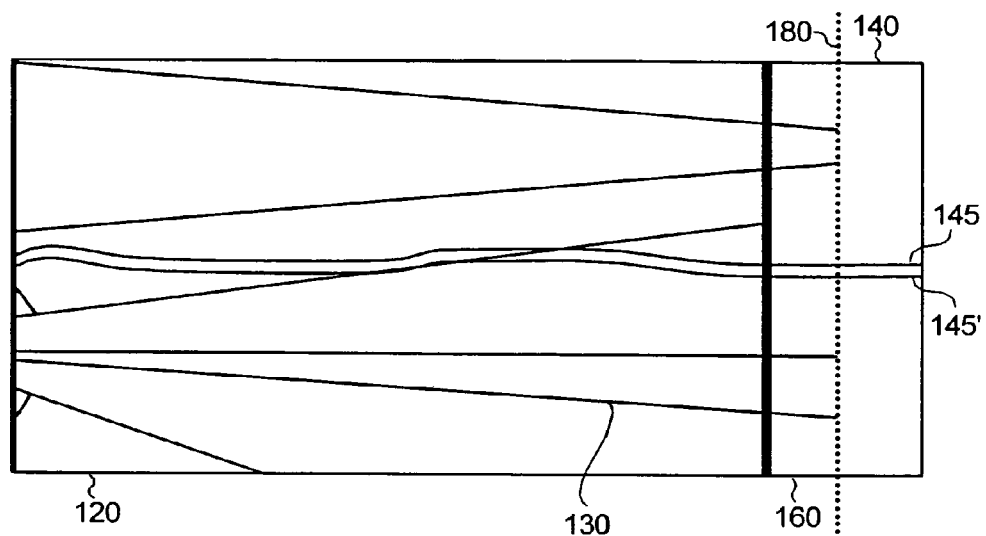
FIG. 3 illustrates a step in a line beam sequential lateral solidification to produce directional crystals according to one or more embodiments of the present invention.

FIG. 3 shows the region 140 of film after crystallization is almost complete. The crystals have continued to grow in the direction of the movement of the film relative to the irradiation region thereby forming a polycrystalline region. The film preferably continues to advance relative to irradiated regions, e.g., region 160 by substantially equal distances. Iterations of moving and irradiating the film are continued until the irradiated area reaches the edge of a polycrystalline region of the film.

By using a number of laser pulses to irradiate a region, i.e., a small translation distance of the film between laser pulses, a film having highly elongated, low defect-density grains can be produced. Such a grain structure is referred to as "directional" because the grains are oriented in a clearly discernable direction. For further details, see U.S. Pat. No. 6,322,625, the contents of which are incorporated herein in their entirety by reference.

According to the above-described method of sequential lateral solidification using high aspect ratio pulses, the entire sample area is crystallized using multiple pulses in a single lateral scan across the substrate. However, the continuous extension of crystal grains can result in the development of localized texture through the widening of crystal grains. Widening of crystal grains occurs as a result of competitive lateral growth between certain crystallographic orientations. Widened grains themselves start to develop many defects and the type (e.g., low-angle grain boundaries, twin boundaries or random high-angle grain boundaries) and density thereof may depend on the crystallographic orientation in the direction of growth. Each grain thus breaks down into a 'family' of grains that have comparable properties. These grain families can become very wide, for example wider than 10 µm or even wider than 50 µm depending on sample configuration and crystallization conditions. As TFT performance depends on both crystallographic orientation of the grains (e.g., through variation of the interface defect density as a function of surface orientation) as well as defect density of the grains, this localized texture can lead to large variation of TFT performance. Thus, it may be desired to interrupt grain growth from time to time or region to region so as to avoid formation of localized texture and the related regional variations in defect density.

In one or more embodiments, crystal structure can be further controlled by interrupting the series of pulses to deliberately discontinue the lateral growth in the direction of the scan. Thus, according to one or more embodiments, the laser irradiation projection onto the substrate surface is blocked and no melting and subsequent crystallization occurs. This results in an intermittent perpendicular grain boundary in the film so that a new set of seeds is created and a "fresh" set of grains start to grow. Interruption of grain growth can prevent excessive widening of grain-families or even localized texture, which may not be desired due to the different effects texture may have on TFT performance and thus pixel brightness. In one or more embodiments, lateral crystal growth is interrupted about every 10-200, or 10-100, pulses, or at a repeating distance of about 20-400, or 20-200, µm. Lateral crystal growth can be interrupted by periodically redirecting the laser beam away from the substrate surface or by positioning a beam block in the laser path for the duration of one or a few pulses. The locations of these perpendicular grain boundaries are well-known and carefully controlled by the process. Pixel and display processing can be designed so as to avoid these regions.

An alternative irradiation protocol, referred to herein as "uniform-grain sequential lateral solidification," or "uniform SLS," is used to prepare a uniform crystalline film characterized by repeating columns of laterally elongated crystals. The crystallization protocol involves advancing the film by an amount greater than the lateral growth length, e.g., δ>LGL, where δ is the translation distance between pulses, and less than two times the lateral growth length, e.g., δ<2 LGL. Uniform crystal growth is described with reference to FIGS. 4A-4C.

Referring to FIG. 4A, a first irradiation is carried out on a film with a narrow, e.g., less than two times the lateral growth length, and elongated, e.g., greater than 10 mm and up to or greater than 1000 mm, laser beam pulse having an energy density sufficient to completely melt the film. As a result, the film exposed to the laser beam (shown as region 400 in FIG. 4A), is melted completely and then crystallized. In this case, grains grow laterally from an interface 420 between the unirradiated region and the melted region. By selecting the laser pulse width so that the molten zone width is less than about two times the characteristic LGL, the grains growing from both solid/melt interfaces collide with one another approximately at the center of the melted region, e.g., at centerline 405, and the lateral growth stops. The two melt fronts collide approximately at the centerline 405 before the temperature of the melt becomes sufficiently low to trigger nucleation.

Figure 4D:
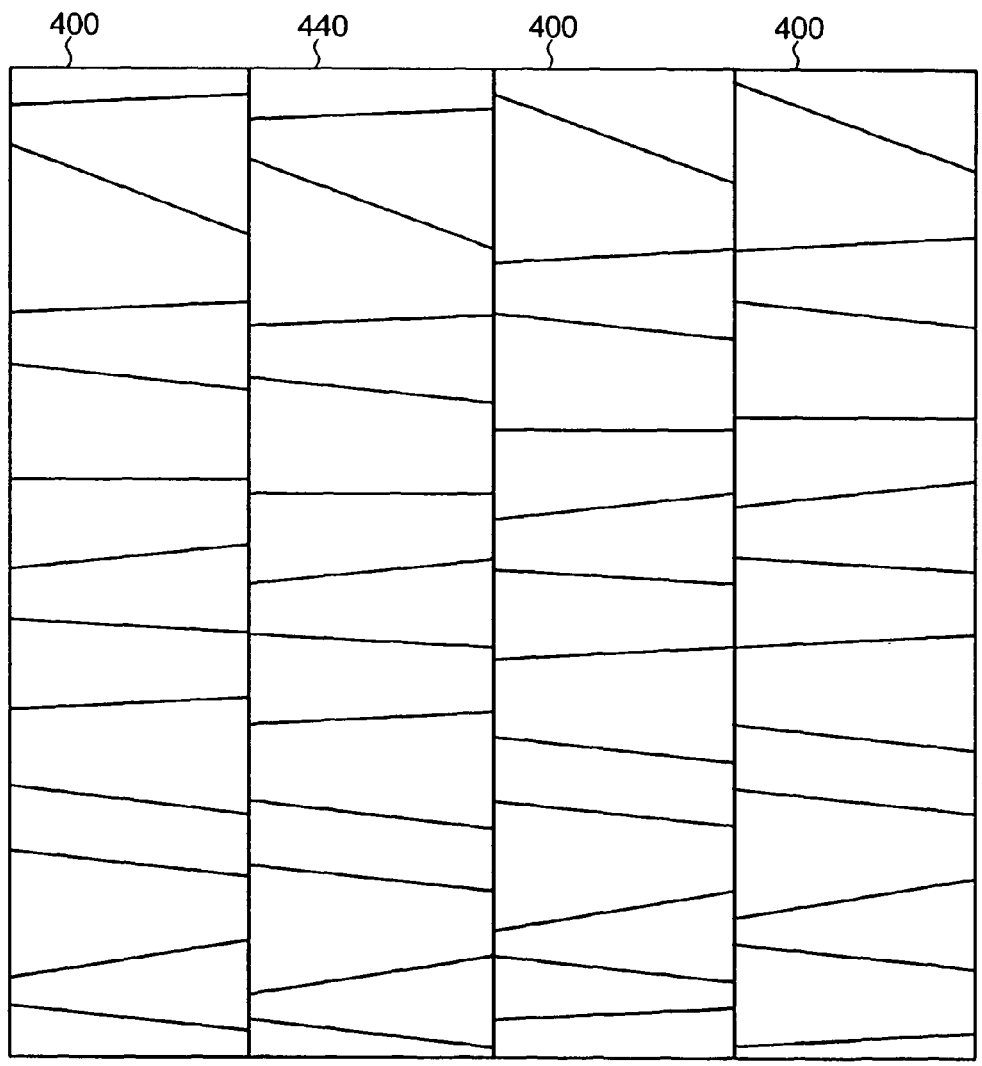

Referring to FIG. 4B, after being displaced by a predetermined distance δ that is at least greater than about LGL and less than at most two LGL, a second region of the substrate 400' is irradiated with a second laser beam pulse. The displacement of the substrate, δ, is related to the desired degree of overlap of the laser beam pulse. As the displacement of the substrate becomes longer, the degree of overlap becomes less. It is advantageous and preferable to have the overlap degree of the laser beam to be less than about 90% and more than about 10% of the LGL. The overlap region is illustrated by brackets 430 and dashed line 435. The film region 400' exposed to the second laser beam irradiation melts completely and crystallizes. In this case, the grains grown by the first irradiation pulse serve as crystallizing seeds for the lateral growth of the grains grown from the second irradiation pulse. FIG. 4C illustrates a region 440 having crystals that are laterally extended beyond a lateral growth length. Thus, a column of elongated crystals are formed by two laser beam irradiations on average. Because two irradiation pulses are all that is required to form the column of laterally extended crystals, the process is also referred to as a "two shot" process. Irradiation continues across the substrate to create multiple columns of laterally extended crystals. FIG. 4D illustrates the microstructure of the substrate after multiple irradiations and depicts several columns 440 of laterally extended crystals.

Thus, in uniform SLS, a film is irradiated and melted with a low number of pulses, e.g., two, which laterally overlap to a more limited extent than for a "directional" film. The crystals that form within the melted regions preferably grow laterally and with a similar orientation, and meet each other at a boundary within the particular irradiated region of film. The width of the irradiation pattern is preferably selected so that the crystals grow without nucleation. In such instances, the grains are not significantly elongated; however, they are of uniform size and orientation. For further details, see U.S. Pat. No. 6,573,531, the contents of which are incorporated herein in their entirety by reference.

In general, the film itself is not required to move during crystallization; the laser beam or a mask defining the laser beam shape could be scanned across the film instead to provide a relative motion of the irradiated region and the film. However, moving the film relative to the laser beam may provide improved uniformity of the laser beam during each subsequent irradiation event.

Unlike conventional 2D projection SLS, where the width of the molten zone is relatively invariant along its length, there are additional non-marginal sources of beam distortions in 1D projected line beam laser pulse. The molten zone width in a line scan SLS process can vary to a significant degree along the length of the irradiated region. The variation in the molten zone width is due to a number of factors, such as depth of focus limitations, edge blurring of the laser beam profile, pulse to pulse energy density variations, within sample thickness variations, substrate thickness variations, stage nonplanarities, refraction non-uniformities in the optical elements, imperfections in reflective optics, intensity deviations from ideal Gaussian short axis and Top-Hat long-axis raw beam profile, etc. These effects become more apparent along the length of the irradiated region due to the high aspect ratio of the beam in the length direction. Deviations from a target width are observed even in those instances when a mask is used to help shape the beam and to provide a sharp energy density profile. Deviations in width can be quite significant; variations in width along the length of +/−10% are common and variations of up to +/−50% have been reported.

Figure 5:
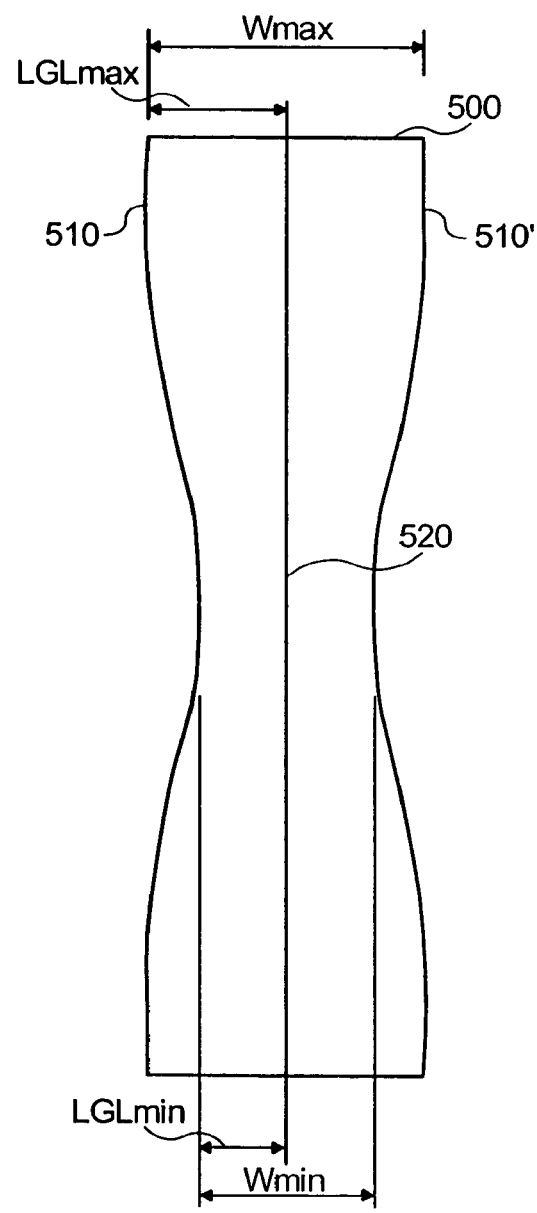
FIG. 5 is a schematic illustration of a line beam pulse varying in width along its length.

This is illustrated schematically in FIG. 5, which depicts a planar/top view of a molten region 500 of a film after irradiation with a line beam laser pulse. The variation in width along the length has been exaggerated for purposes of illustration. The molten region includes long edges 510 and 510' that demonstrate a variation in the beam pulse width. At its widest point, the molten region has a width $W_{max}$. At its narrowest point, the molten region has a width $W_{min}$. During crystallization, the crystals grow laterally from long edges 510, 510' towards an imaginary centerline 520. The centerline is used as a measuring point because the laterally grown crystals from opposition sides of the melt region generally meet approximately at the centerline. The resultant laterally grown crystals can have significantly different length and will have for example, a length ranging from $LGL_{max}$ corresponding to about one-half $W_{max}$ to $LGL_{min}$ corresponding to one-half $W_{min}$.

Under such beam distortion conditions, the conventional step distance—greater than the average lateral growth length ("$LGL_{avg}$") and less than two times the average lateral growth length ("$2LGL_{avg}$") may not provide uniform grain structure. This is illustrated with reference to FIGS. 6A and 6B. In FIG. 6A, a laterally crystallized region 600 showing distortion in the molten zone width along the length is shown. The grains grow laterally until they meet at centerline 610, creating laterally grown crystals of different grain length. A crystal 620 has a maximum grain length, $LGL_{max}$, which is indicated in FIG. 6A. A crystal 630 has a minimum grain length, $LGL_{max}$, which is also indicated in FIG. 6A. If the sample is moved a distance that is, for example, more than $LGL_{avg}$ and less than two times $LGL_{avg}$, the second layer pulse may not completely overlap with the laterally grown crystals of region 600. Regions of the film are not irradiated, resulting in islands 670 of amorphous or low-quality crystalline material.

Figure 6C:
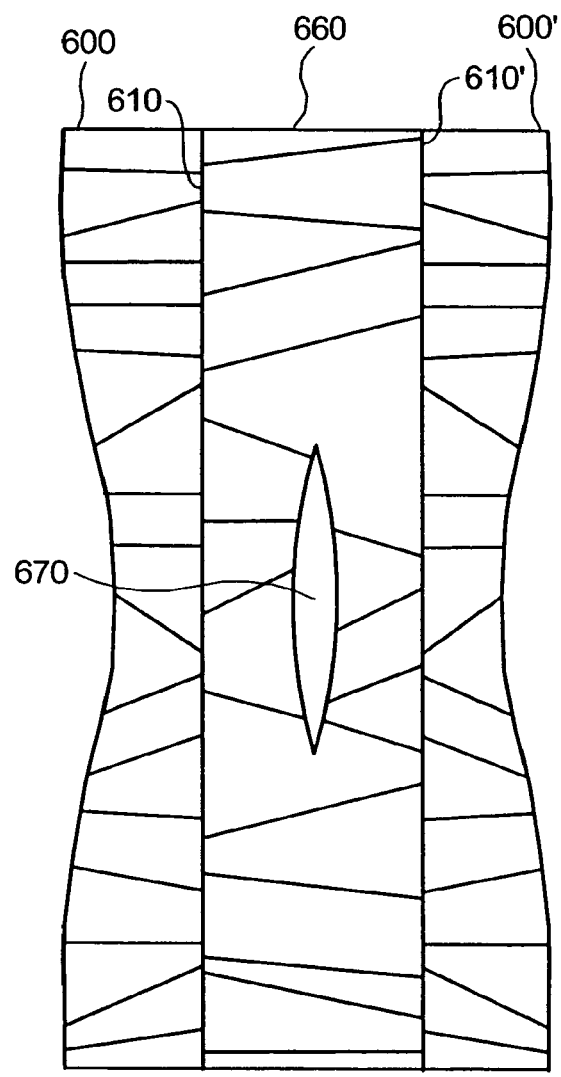

FIG. 6B shows a second irradiated region 600' that is stepped from the first region a distance that is more than $LGL_{avg}$ and less than two times $LGL_{avg}$. The overlap between the two irradiated regions is indicated by bracket 650 and by dashed line 640. Region 670 is not irradiated by either the first or second irradiation pulse. Upon lateral solidification, as indicated in FIG. 6C, a region 660 having crystals that are laterally extended beyond a lateral growth length are formed, however, an amorphous or polycrystalline island 670 remains within region 660. If a TFT device were located over a portion of region 660 that includes the amorphous region 670, the performance of the TFT would be adversely affected. Thus, distortions in the beam width should be accounted for in determining the step distance for a two-shot process. In addition to the variations in the width of a single molten region, pulse-to-pulse variations, e.g., in focus or energy density, cause differences in width among molten regions. Thus, $LGL_{min}$ and $LGL_{max}$ may actually be even smaller or larger due to pulse-to-pulse variations and this increased range can be taken into account as well.

Figure 7A:
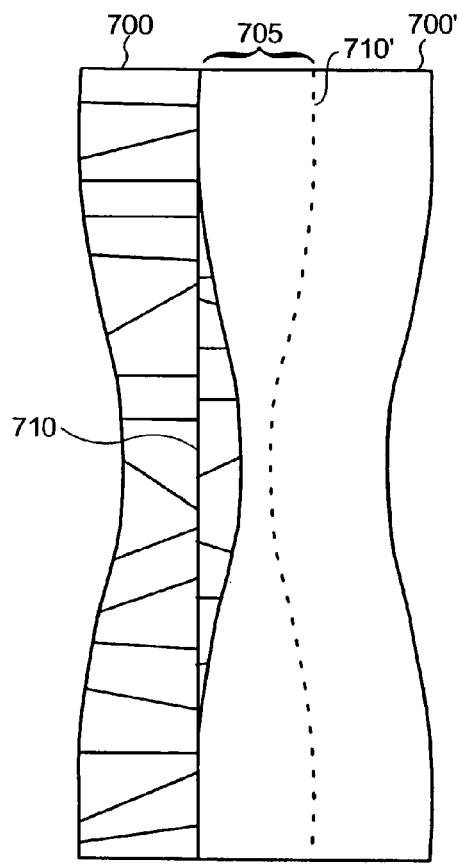
FIGS. 7A and 7B illustrate a line beam sequential lateral solidification that undershoots the desired stepping distance according to a conventional sequential lateral solidification process.
Figure 7B:
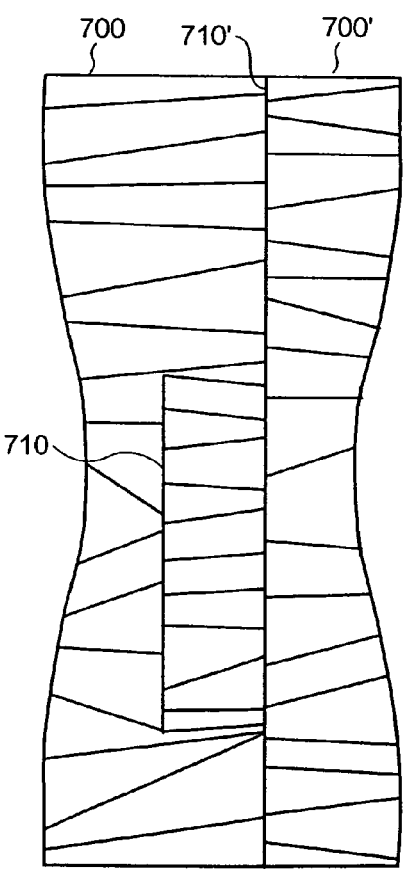

The above example describes a scenario where the second laser pulse "overshoots" the crystallized region 600, resulting in an unirradiated region 670. Another example of misalignment of the second laser pulse arises when the stepping distance is too small and the second pulse "undershoots" the crystallized region 700 so that a two shot process is not achieved in some locations. As illustrated in FIG. 7A, the laser pulse 700' does not cross over centerline 710 along the entire length of region 700. The overlap region is indicated by bracket 705 and dashed line 710. In those portions where the second laser pulse 700' does not pass over centerline 710, directional crystallization (and not uniform crystallization) results. In those portions where the second laser pulse 600' passes over centerline 710, as is desired for a two step process, uniform crystallization results. FIG. 7B. illustrates the resultant crystallization grain structure.

In order to avoid such defects in the laser irradiation process and according to one or more embodiments of the invention, the sample is stepped a distance δ that is greater than about one half $W_{max}$ and less than about $W_{min}$, that is $W_{max} < δ < 2W_{min}$. As noted above, the resultant laterally grown crystals will vary. $LGL_{max}$ is the longest lateral grain length in a region after irradiation and lateral crystallization and corresponds to one half $W_{max}$. Similarly, $LGL_{min}$ is the shortest lateral grain length in a region after irradiation and lateral crystallization and corresponds to $W_{min}$. By defining the stepping distance in this manner, there is complete overlap from one irradiation act to the next and islands of unirradiated substrate are avoided. By requiring that δ be greater than one half $W_{max}$, the second laser pulse is certain to cross the centerline of the laterally crystallized region (and to avoid the problems described above with reference to FIGS. 7A-B) and to thereby assure that only uniform grain growth occurs. By requiring that δ be less than $W_{min}$, overstepping and gaps in irradiation giving rise to islands of amorphous material are avoided (as described above with reference to FIGS. 6A-C).

Figure 8A:
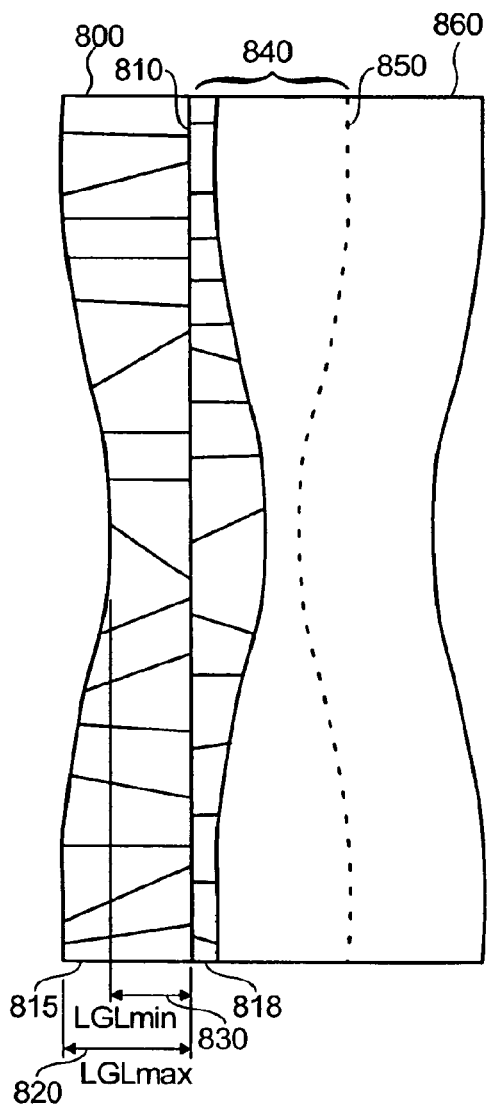
FIGS. 8A and 8B illustrate a line beam sequential lateral solidification embodying a desired stepping distance according to one or more embodiments of the present invention.
Figure 8B:
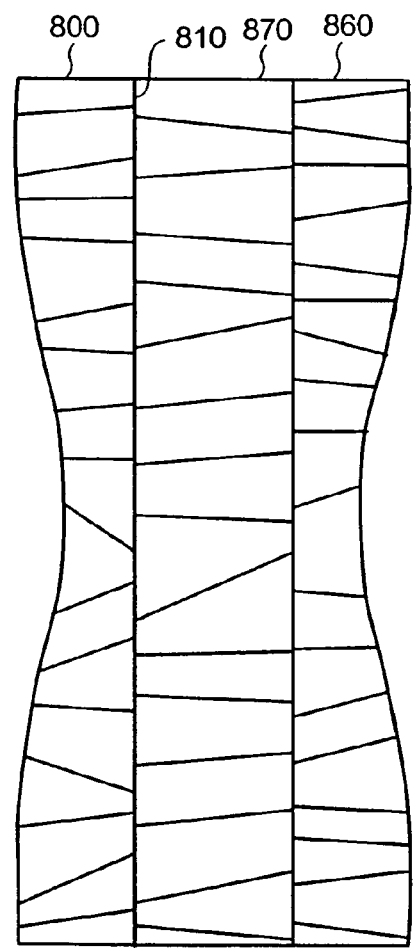

This is illustrated in FIGS. 8A and 8B, where the translational distance δ is selected to provide optimal overlap between first and second laser irradiation pulses. In FIG. 8A, crystals 815 and 818 are laterally grown from a molten region 800 having variation in the width along its length and giving rise to crystals of varying length. A crystal 820 has a maximum grain length, $LGL_{max}$, which is indicated in FIG. 8A. A crystal 830 has a minimum grain length, $LGL_{min}$, which is also indicated in FIG. 8A. The sample is moved a distance that is more than $LGL_{max}$ and less than two times $LGL_{min}$ (and also more than one half $W_{max}$ and less than $W_{min}$). The overlap between first and second positions is indicated by bracket 840 and dashed line 850. The film region 860 that is exposed to the second laser beam irradiation is melted and crystallized. In this case, the grains grown by the first irradiation pulse serve as crystallizing seeds for the lateral growth along the entire length of laser pulse. FIG. 8B illustrates a region 870 having crystals that are laterally extended beyond a lateral growth length (and are all of substantially similar length). Thus, a column of elongated crystals of uniform LGL are formed by two laser beam irradiations on average and overshooting and undershooting or the stepping distance is avoided.

$LGL_{max}$ and $LGL_{min}$ are a function of the specific crystallization conditions for a particular set of laser conditions and substrate properties. Specific values for $LGL_{max}$ and $LGL_{min}$ can be determined empirically by conducting a controlled irradiation of a sample and measuring the variation lateral growth length, for example, by inspection of the resultant crystals at high magnification. Alternatively, the variation in beam width (and corresponding variation in lateral growth length) can be reasonably estimated using process models that define the effect of processing variables on crystallization. Processing variables such as film thickness, within film thickness variability, depth of focus limitations, pulse to pulse energy density variations, and the like can be input into a model that understands or defines how the individual and/or collective factors operate to affect the crystallization process. Models suitable for adaptation for this purpose have been previously described. See, Robert S. Sposili, Doctoral Dissertation, Chapter 8: "Mathematical Model of the SLS process", Columbia University, 2001.

While the variation in beam width has a particularly noted effect on uniform grain growth, SLS processes for directional line beam SLS also may be designed with this variation in mind. Thus, the stepping distance in a directional SLS process should be less than $LGL_{min}$. Because the stepping distances in directional grain growth are typically small, this requirement is met by most processing protocols.

In another aspect of the invention, the translation distance from pulse to pulse is varied as the laser is scanned across the substrate in order to obtain selected crystallization features in different regions of the film. In one or more embodiments, a film is subjected to line beam SLS crystallization in which at least two regions of the film are translated at different pulse to pulse translation distances.

For example, a first region of the film is subjected to line beam SLS crystallization while the film moves at a velocity to provide a pulse to pulse translation distance sufficient to produce a uniform crystal grain structure, e.g., $LGL_{max} < \delta < 2LGL_{min}$, and a second region of the film is subjected to line beam SLS crystallization while the film moves at a velocity to provide a pulse to pulse translation distance sufficient to produce a directional crystal grain structure, e.g., $\delta < LGL_{min}$. The changes in pulse to pulse translation distances occur in a single scan across the substrate or portion of the substrate that is being crystallized.

By way of a further example, a first region of the film is subjected to line beam SLS crystallization while the film moves at a velocity to provide a first pulse to pulse translation distance sufficient to produce a directional crystal grain structure, and a second region of the film is subjected to line beam SLS crystallization while the film moves at a velocity to provide a second pulse to pulse translation distance sufficient to produce a directional crystal grain structure, wherein the first and second pulse to pulse translation distances are different. The laser repetition rate is typically constant. Alternatively, the substrate velocity is constant and the laser repetition rate is varied to alter the pulse to pulse translation distances in the two regions of the film.

Figure 9:
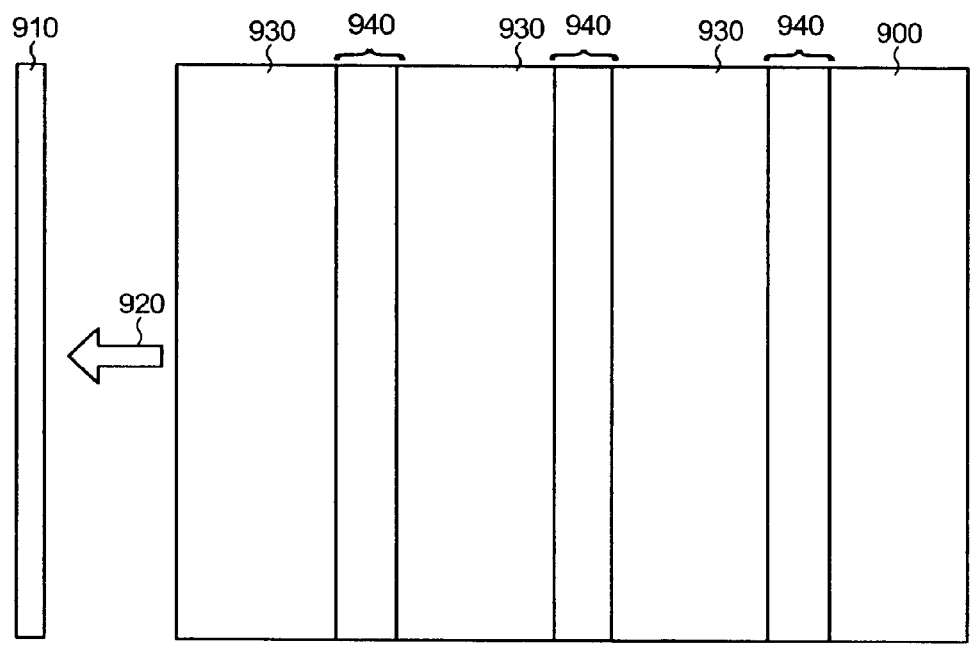
FIG. 9 is a schematic illustration of a pulsed line beam laser crystallization process employing two or more pulse to pulse translation distances according to one or more embodiments of the present invention.

The process is illustrated in FIG. 9. A film sample 900 is illuminated by a line beam laser pulse 910 as the film moves under the line beam laser pulse in the direction indicated by arrow 920. The sample is capable of moving at different rates so that the pulse to pulse translation distance can be varied. In other embodiments, the pulse to pulse translation distance is varied by varying the laser pulse frequency. As section 930 of film sample 900 moves under the laser line beam, the film moves at a first rate, for example, to provide a pulse to pulse translation distance suitable for obtaining uniform crystal growth. As section 940 of film sample 900 moves under the laser line beam, the film moves at a second rate, for example, to provide a pulse to pulse translation distance suitable for obtaining directional crystal growth. In this way, regions having different crystal structure can be formed in a single scan of a pulsed laser line beam across a section of the film. The section may be the entire length (L) of the film sample, or a portion thereof, e.g., L/2, L/4, etc.

It has been previously observed that film properties, such as electron mobility in a silicon film, degrade with increasing translation distance δ in the directional SLS regime where the translation distance is less than the lateral growth length. In a similar fashion, film properties differ between directionally grown and uniformly grown crystals. Directionally grown crystals typically exhibit superior film properties, however, this comes at the cost of reduced material throughput. By varying the pulse to pulse translation distances of the film as the laser scans across the selected region of the substrate, it is possible to maximize resources (e.g., laser energy) and increase throughput by irradiating each region using the maximum translation distance able to provide the desired film properties. The locations of these different crystalline regions are well-known and carefully controlled by the process. Pixel and display processing can be designed so as to place these devices in the appropriate crystalline region.

In another aspect, film regions having difference film properties are obtained by selectively pretreating film regions to impart desired film properties. The quality of the film is controlled by pre-crystallizing regions of the substrate using a texture inducing and grain-size enlarging process. Subsequently the precrystallized substrate is processed by SLS, e.g., uniform SLS, to obtain regions of different crystalline properties.

A textured film contains grains having predominantly the same crystallographic orientation in at least a single direction; however, they are randomly located on the surface and are of no particular size (microstructure). More specifically, if one crystallographic axis of most crystallites in a thin polycrystalline film points preferentially in a given direction, the texture is uni-axial texture. For the embodiments described herein, the preferential direction of the uni-axial texture is a direction normal to the surface of the crystallites. Thus, "texture" refers to a uni-axial surface texture of the grains as used herein. The degree of texture can vary depending upon the particular application. Crystallographic orientation is a <111> orientation or in another embodiment is a <100> orientation or in another embodiment crystallographic orientation includes <110> orientation. In another embodiment, different regions of the film include different crystallographic orientations.

Differences in crystal orientation however may lead to differences in device behavior. Uniformity can be improved by controlling the orientation of the grains that are grown in an SLS process. Because all the grains have the same crystallographic orientation within the treated region, TFT uniformity for a device(s) located within the region is improved. Devices can be selectively located in regions of selected orientation. For example, a higher degree of texture is preferable for a thin film transistor (TFT) being used for a driver circuit as opposed to a TFT that is used for a switch circuit.

In order to provide regions having different crystalline morphologies and different film properties, select regions of the film may be treated to introduce a selected texture and large grain size into regions of the film. Many texture-inducing methods lead to large grain size. Grains with a particular orientation grow at the expense of others thereby reducing the number of grains and increasing their average size. Conventional methods of obtaining a precursor textured film include zone melt recrystallization (ZMR), solid phase recrystallization, direct deposition techniques (chemical vapor deposition (CVD), sputtering, evaporation), surface-energy-driven secondary grain growth (SEDSGG) and pulsed laser crystallization (SLS, multiple-pulse ELA) methods. It is envisioned that other texture-inducing methods may also be used in a similar way to generate the textured precursors.

As is discussed in co-pending, co-owned U.S. application Ser. No. 10/994,205, entitled "Systems And Methods For Creating Crystallographic-Orientation Controlled Poly-Silicon Films," incorporated herein by reference, orientation of the crystallized film may be obtained by first creating the desired texture in the film using established texturing techniques and then creating the desired crystalline microstructure using a selected SLS crystallization process.

A display is composed of a grid (or matrix) of picture elements ("pixels"). Thousands or millions of these pixels together create an image on the display. Thin film transistors (TFTs) act as switches to individually turn each pixel "on" (light) or "off" (dark). The TFTs are the active elements, arranged in a matrix, on the display. Currently, such active matrices require connections to external drive circuitry. Current development efforts are directed to integration of driver circuitry of the TFT onto the same semiconductor film. Driver circuitry typically has more stringent performance requirements, e.g., higher electron mobility, low leakage currents and threshold voltages, than that of the pixel TFT. The ability to alter the crystal grain structure of the silicon film by altering the translation distance in a line beam SLS process would allow developers to tailor a polycrystalline silicon film for specific integration and display applications.

In another aspect, the angle of crystallization is offset slightly from the edges of the substrate, e.g., display panel. When the line scan laser pulse is aligned with the edges of the display panel, there is a chance that columns of similarly bright pixels will result despite the averaging out of pulse-to-pulse fluctuations. In such cases, it may be desirable to slightly offset the direction of scan in order to create a tilted microstructure. Tilt is chosen such that TFT regions that are crystallized using the same series of laser pulses are spaced far apart. In one or more embodiments, a small tilt angle such as about 1-5°, or about 1-20°, is used.

Figure 10A:
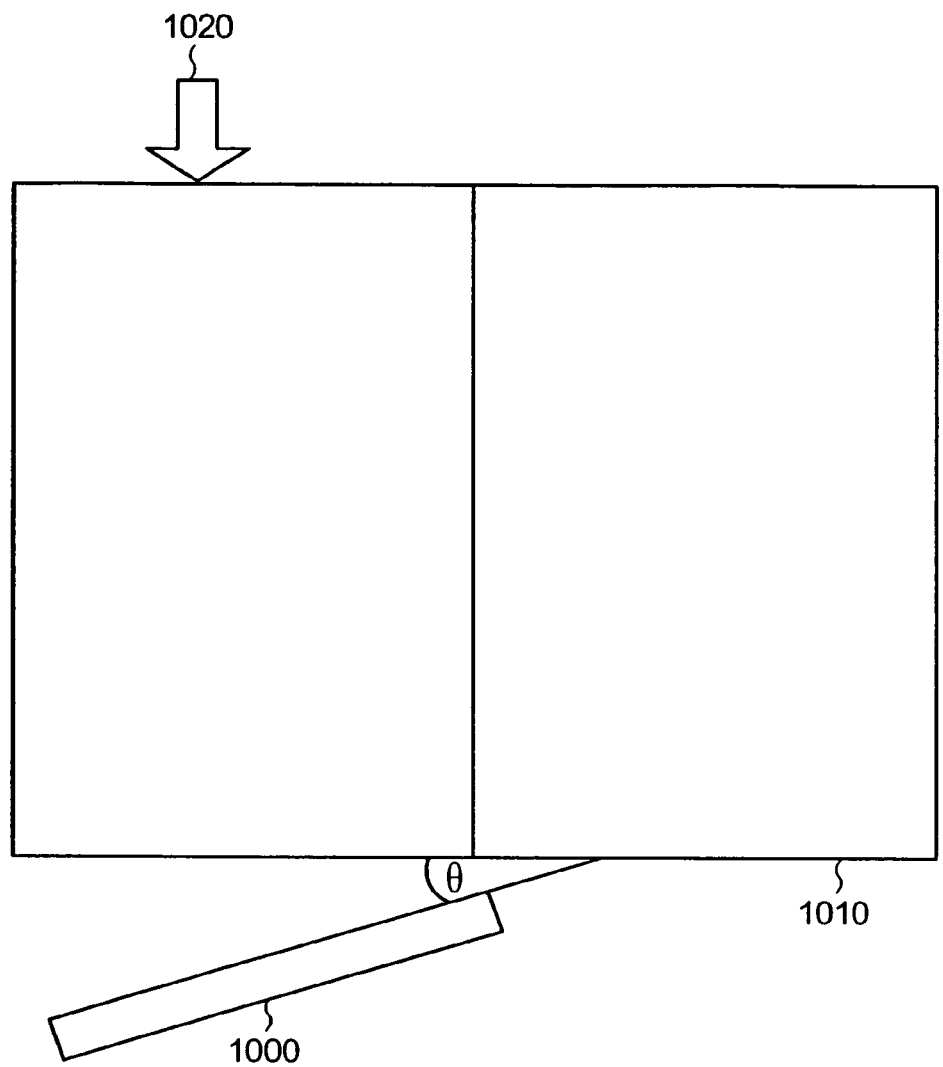
FIGS. 10A and 10B are schematic illustrations of a pulsed line beam laser crystallization process conducted at an angle with respect to the substrate according to one or more embodiments of the present invention.
Figure 10B:
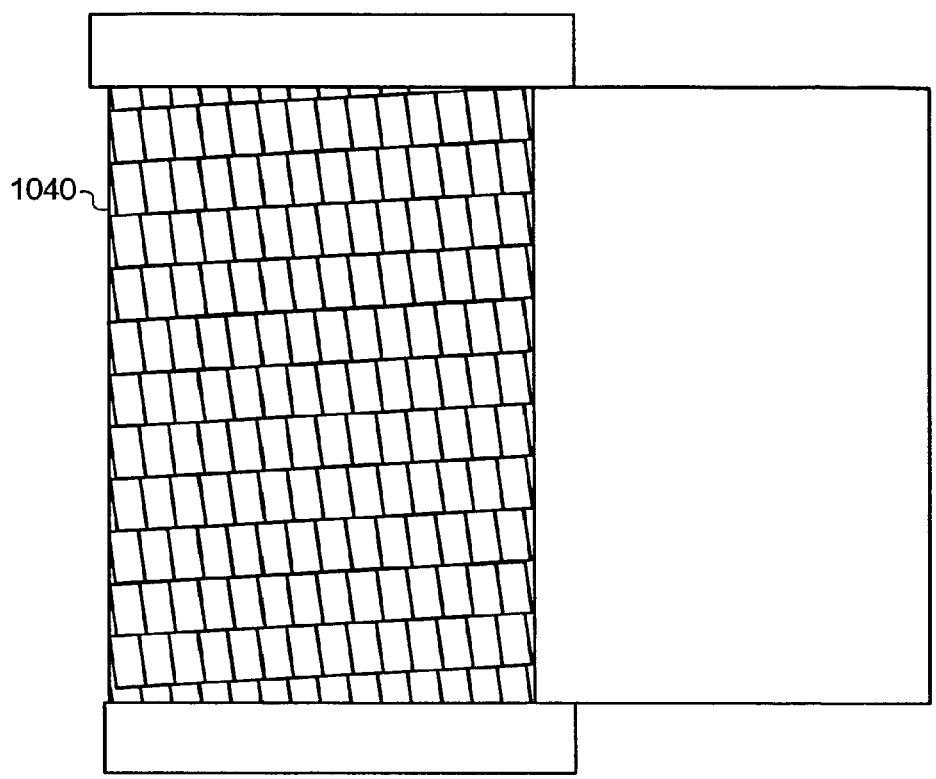

FIG. 10A is a schematic illustration of a laser and sample arrangement for implementing surface crystallization at an angle. In one or more embodiments, a pulsed laser line beam 1000 is shaped at an angle θ with response to the substrate 1010. The length of the line beam, $L_{lb}$, is selected to cover the entire selected section of the film sample, x. The relationship between the line beam length and the film sample section is $L_{lb} \cos \theta = x$. The sample moves in the direction indicated by arrow 1020. An exemplary crystal grain structure is shown in FIG. 10B.

The use of tilted grain boundaries is advantageous in uniform grain structures. While uniform crystallization provides location control of grain boundaries and periodic uniform grain structure, the periodicity is controlled only in the long dimension of the grains. However, the spacing between the short grain boundaries cannot be controlled. It may be desirable to locate TFTs on a silicon substrate at a tilt angle relative to the long dimension grain boundaries of a uniformly crystallized film. See, US 2005/0034653, entitled "Polycrystalline TFT Uniformity Through Microstructure Misalignment," which is incorporated by reference. While this may be accomplished by tilting the TFT, TFT fabrication protocols makes this difficult. According to one or more embodiments, a periodic uniform grain structure at an angle with respect to the substrate edge is provided. TFTs can then be manufactured by conventional methods.

Directionally oriented crystals will also benefit from a deliberate tilt in the crystal orientation. Although a directionally oriented polycrystalline film does not have repeating long grain boundaries perpendicular to the direction of grain growth, as is observed for uniform polycrystalline materials, the film may nonetheless exhibit periodic variations in film properties, most notably, in film thickness. SLS crystallization results in an undulation or periodic variation in the film thickness and gives rise to high and low regions across a film area. Device properties are a function of film thickness, surface morphology, e.g., through variations in the electric field over the gate dielectric (and thus into the semiconductor film) as it is either convexly or concavely curved, and thickness variations of the gate dielectric resulting form morphology of the surface (e.g., during gate dielectric film deposition, better coverage may be achieve on planer regions than on sloped regions). Orienting the directional grains at an tilt angle with respect to the edge of the substrate and with respect to any TFT devices that may be fabricated in the film, serves to bridge each TFT device over regions of both high and low thickness and thereby average out any performance differences. Tilt engineering in directional SLS is also a way to avoid having multiple adjacent pixel TFTs to fall within the same 'grain family.' When the grains grow diagonally with respect to the pixel TFT array, one can imagine that a grain family intersects a TFT channel only one out of several TFTs.

Figure 11:
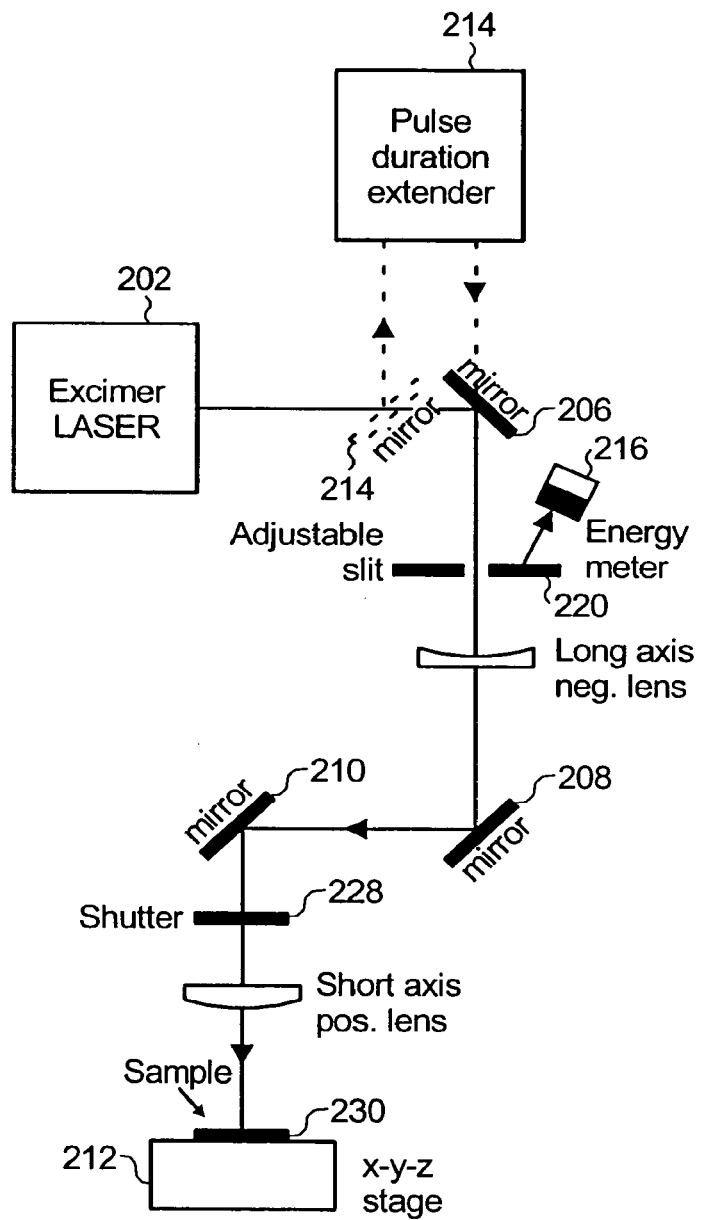
FIG. 11 is a schematic illustration of a laser system for use in one or more embodiments of the present invention.

A schematic illustration of a line scan crystallization system 200 using high aspect ratio pulses is shown in FIG. 11. The system includes a laser pulse source 202, operating for instance at 308 nm (XeCl) or 248 nm or 351 nm. A series of mirrors 206, 208, 210 direct the laser beam to a sample stage 212, which is capable of sub-micron precision in the x-, and z- (and optionally y-) directions. The system also includes slit 220 that may be used to control the spatial profile of the laser beam and energy density meter 216 to read the reflection of slit 220. Shutter 228 can be used to block the beam when no sample is present or no irradiation is desired. Sample 230 may be positioned on stage 212 for processing.

Laser-induced crystallization is typically accomplished by laser irradiation using a wavelength of energy that can be at least partially absorbed by the film, with an energy density, or fluence, high enough to melt the film. Although the film can be made of any material susceptible to melt and recrystallization, silicon is a preferred material for display applications. In one embodiment, the laser pulses generated by the source 202 have an energy in the range of 50-200 mJ/pulse and a pulse repetition rate around 4000 Hz or more. Excimer lasers currently available from Cymer, Inc. San Diego, Calif., can achieve this output. Although an excimer laser system is described, it is appreciated that other sources capable of providing laser pulses at least partially absorbable by a desired film may be used. For example, the laser source may be any conventional laser source, including but not limited to, excimer laser, continuous wave laser and solid-state laser. The irradiation beam pulse can be generated by another known source or short energy pulses suitable for melting a semiconductor can be used. Such known sources can be a pulsed solid state laser, a chopped continuous wave laser, a pulsed electron beam and a pulsed ion beam, etc.

The system optionally includes a pulse duration extender 214 that is used to control the temporal profile of the laser pulses. Optional mirror 204 can be used to direct the laser beam into extended 214, in which case mirror 206 would be removed. Since crystal growth can be a function of the duration of the laser pulse used to irradiate the film, pulse duration extender 214 can be used to lengthen the duration of each laser pulse to achieve a desired pulse duration. Methods of extending pulse durations are known.

Slit 220 can be used to control the spatial profile of the laser beam. Specifically, it is used to give the beam a high aspect ratio profile. The laser beam from source 202 may have a Gaussian profile, for example. Slit 220 significantly narrows one spatial dimension of the beam. For example, before slit 220, the beam may be between 10 and 15 mm wide and 10 to 30 mm long. The slit could be substantially thinner than the width, for example about 300 microns wide, which results in a laser pulse that has a short axis of about 300 microns, and a long axis that may be unmodified by the slit. Slit 220 is a simple method of producing a narrow beam from a relatively wide beam, and also has the benefit of providing a 'top hat' spatial profile, which has a relatively uniform energy density across the short axis. In another embodiment, instead of using slit 220, a very short focal length lens can be used to tightly focus one dimension of a laser beam onto the silicon film. It is also possible to focus the beam onto the slit 220; or, more generally, using optical elements (e.g., a simple cylindrical lens) to narrow the short axis of the beam from source 202 so that less energy is lost upon passing slit 220 yet some sharpening is achieved.

The laser beam is then modified using two fused silica cylindrical lenses 220, 222. The first lens 220, which is a negative focal length lens, expands the size of the long axis of the beam, the profile of which may be relatively uniform, or may have gradual changes that are not apparent over the length of the long axis. The second lens 222 is a positive focal length lens that reduces the size of the short axis. The projection optics reduce the size of the laser beam in at least the short dimension, which increases the fluence of the laser pulse when it irradiates the film. The projection optics may be a multiple-optic system that reduces the size of the laser beam in at least the short dimension by a factor of 10-30×, for example. The projection optics may also be used to correct for spatial aberrations in the laser pulses, for example spherical aberrations. In general, the combination of slit 220, lenses 220, 222, and the projection optics is used to ensure that each laser pulse irradiates the film with an energy density that is high enough to melt the film, with a homogeneity and length along the long axis that is sufficiently long to minimize or eliminate variations of the crystallization of the film. Thus, for example, a 300 micron wide beam is reduced to, for example, a 10 micron width. Narrower widths are also contemplated. Homogenizers may also be used on the short axis.

In some embodiments, the line scan crystallization system 200 can include a variable attenuator and/or a homogenizer, which can be used to improve the spatial homogeneity along the long axis of the laser beam. The variable attenuator can have a dynamic range capable of adjusting the energy density of the generated laser beam pulses. The homogenizer can consist of one or two pairs of lens arrays (two lens arrays for each beam axis) that are capable of generating a laser beam pulses that have uniform energy density profiles.

The line scan crystallization system is configured to create a long and narrow laser beam that measures, for example, about 4-15 μm on the short axis and can be 50-100 microns on the long axis in some embodiments, and tens of centimeters or up to more than one meter on the long axis in other embodiments. In general the aspect ratio of the beam is high enough that the irradiated region can be considered a "line." The length to width aspect ratio may be in the range of about 50 up to about $1\times10^5$ or more, for example. In one or more embodiments, the width of the short axis does not exceed the width of twice the characteristic lateral growth length of the laterally solidified crystals, so that no nucleated polysilicon is formed between the two laterally grown areas. This is useful for the growth of "uniform" crystals and also for the general improvement of crystal quality. The desired length of the long axis of the laser beam may be dictated by the size of the substrate, and the long axis may extend substantially along the entire length of the substrate, or of the display to be fabricated (or a multitude thereof), or of a single TFT device in the display, or a TFT circuit on the periphery of the display (e.g., containing drivers) or in other words the integration area. The beam length can in fact also be dictated by the dimension of the integration areas of two adjacent displays combined. In this way, the entire thin film (or a driver circuitry) may be crystallized in preferably one pass of the line beam. The energy density, or fluence, uniformity along the length of the beam is preferably uniform and for example varies by no more than 5% along its entire length. In other embodiments, the energy density along the length of the beam covering the length of interest is of a sufficiently low value that no agglomeration occurs in either one or as a result of a series of overlapping pulses. Agglomeration is a result of localized high energy density that can lead to film disruption.

In some embodiments, the process employs a high frequency, high power pulsed laser source. The high power laser provides sufficient energy per pulse to provide adequate energy density across the length of an irradiated region that the pulse may melt a film within that region. The higher frequency permits a film to be scanned or translated relative to the irradiated region at a rate that can be used in commercially practical applications. In one or more embodiments, the laser source is capable of a pulse frequency of greater than about 1 kHz, or up to about 9 kHz. In other embodiments, the laser source is capable of a pulse frequency of up to 100 kHz or more, which is a range made possible by pulsed solid-state lasers.

The described system can be used to create, for example, "directional" and/or "uniform" crystalline films. High throughput rates can be obtained with a high repetition laser, for example, a 4 kHz 600 W laser in a system creating a 1 m×6 µm size laser line beam with an optical efficiency of 30% leading to a 750 mJ/cm$^2$ energy density. The resultant line beam can crystallize a film at a rate of 40-80 cm$^2$/s when stepping 1-2 µm to create a "directional" crystalline silicon film, and 160-200 cm$^2$/s when stepping at 4-5 µm to create a "uniform" crystalline silicon film.

The laser source has a low divergence, meaning that it is easy to focus in a small spot. For example, the laser source is capable of focusing to ~100 µm, or even down to ~10 µm. The smaller focus size increases the efficiency of the system because the lateral growth length, and not the beam width, dictates the step size. Since a 1 µm translation step size is used in some applications, finer focusing is clearly beneficial. A wide beam causes an increase of pulses per unit area and thereby a commensurate degradation of the material, e.g., through increased surface roughening or incorporation of impurities from the ambient or possibly from the buffer material.

The system may include optics to provide a tightly focused beam to reduce the size of the short axis of the beam. In general, masking the beam with a slit or mask is not required to obtain long axis irradiation patterns suitable for use in one or more embodiments of the present invention. However, masks or slits may be used to obtain beam patterns of a desired profile. In particular, a mask or slit helps to create a top-hat spatial profile rather than a Gaussian profile, so that the energy density across the beam is more uniform. A 'top hat' profile is preferred for lateral growth, because the "sharper" image leads to a better defined melt-pool with more abrupt edges and lateral growth can proceed immediately. With a Gaussian profile, melting regions may be relatively wide, and potentially only partially melt a portion of the irradiated region, which can slow the lateral growth of crystals. Additionally, pulse-to-pulse energy density fluctuations may lead to variation of the width of the molten region when a Gaussian profile is used, which can lead to a variation in the pulse-to-pulse overlapping causing non uniformities in the laterally grown grains. Also, with a top-hat profile, the heat is evenly distributed in the molten region and therefore can be maximized throughout in order to delay the cooling process and thereby increasing the lateral growth. With a Gaussian beam, maximum heating can only be reached in the center of the irradiate area and as a result, overall less heat is deposited.

Exemplary masks include a slit with appropriate slit spacing, e.g., width and length. The mask can be fabricated from a quartz substrate and includes a metallic or dielectric coating that is etched by conventional techniques to form a mask having features of any shape or dimension. The length of the mask features is chosen to be commensurate with the dimensions of the device that is to be fabricated on the substrate surface. The width of the mask also may be variable depending on the desired features of the irradiated film. In some embodiments it is chosen to be small enough to avoid small grain nucleation within the melt zone, yet large enough to maximize lateral crystalline growth for each laser pulse. The desired dimensions of the mask feature will also depend upon the characteristics of the other optics in the system. By way of example only, the mask feature can generate a beam image at the sample with a long axis of about 10 to 100 cm, and a short axis of about 2 to 10 microns, or about 4-6 microns.

A proximity mask, such as a straight opaque edge, may be used to improve the beam profile. The straight edge reduces the beam width and steepens the beam profile, both of which serve to improve the melt and lateral growth of the crystal grains. The edge of the mask or slit feature may be rough, i.e., not smooth. The edge of the mask or proximity mask deviates from being perfectly straight. The edge roughness can be, for example, a saw tooth or serrated pattern having a pattern frequency of about 3 µm to 50 µm or more. The effect of the edge roughness is that the irradiation pattern forms an undulating non-planar melt interface. When the front is not planar, the grains located near a region of negative curvature tend to grow wider as grain boundaries diverge. Conversely grains located on a region of positive curvature will converge and be consumed. The effect of such curvature is to form more parallel grains in the direction of lateral growth. The width of the parallel grain can be defined by the periodicity of the edge roughness.

Display devices using organic light emitting elements have been developed, which can be fabricated on the crystalline films described herein. The methods described herein can provide crystalline films that have a semiconductor grain structure that varies by less than about 5% along the length of a display device. In a typical active matrix organic light emitting diode (AM-OLED) display, organic emitter layers are sandwiched between two electrodes, and electric energy is transformed into light through the excitation of the organic molecules. A display device in which a pixel is composed of organic light emitting elements is self-luminous and, unlike liquid crystal displays, does not require an independent light source as a backlight. Light-emitting devices have large emitting areas and high levels of brightness. Therefore, AM-OLED displays provide display devices of reduced weight and thickness.

Figure 12:
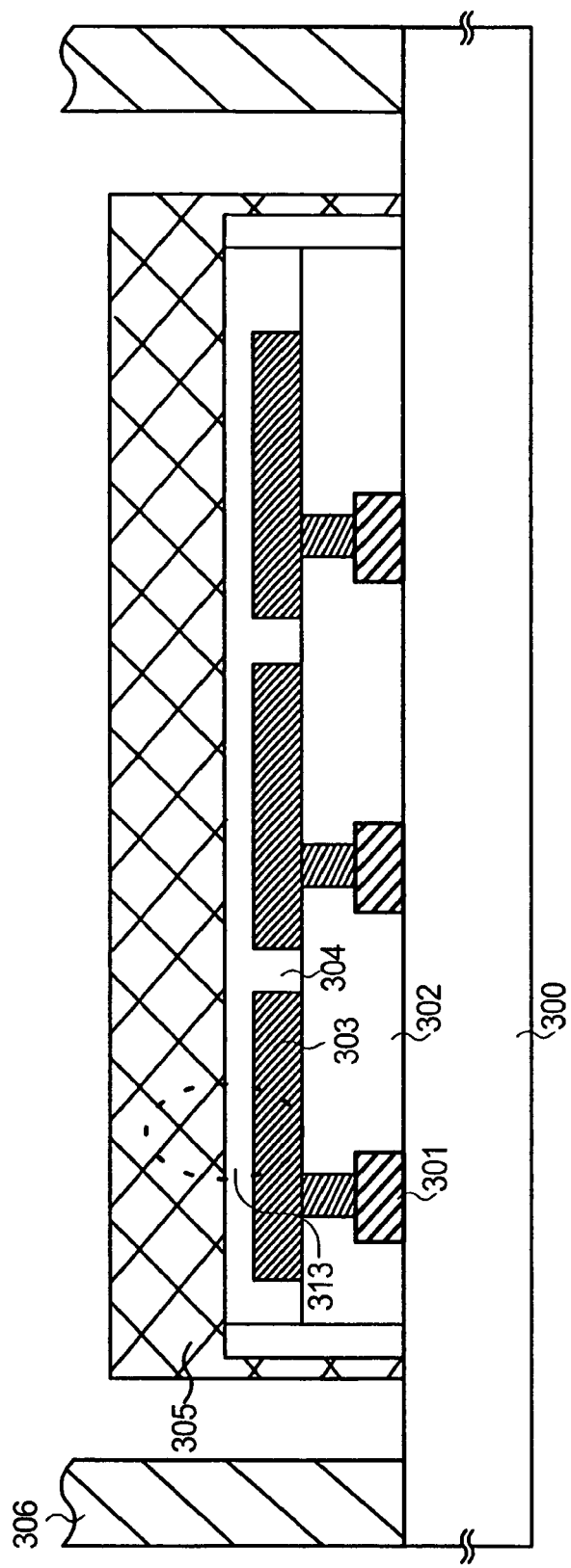
FIG. 12 is a cross-sectional illustration of a conventional AM-OLED.

FIG. 12 is a cross-sectional illustration of a conventional active matrix display that uses an organic light emitting element. Substrate 300 is transmissive of light. An organic light emitting element 313 includes a pixel electrode 303, an organic compound layer 304, and an opposite electrode 305. The pixel electrode of the organic light emitting element is in contact with the top face of an interlayer insulating film 302, with inner walls of a contact hole that pierces the interlayer insulating film to reach control circuit 301. The pixel electrode is also in contact with the top of the control circuit. Control circuit 301 is composed of at least TFTs, and can be composed of one switching TFT and one current controlling TFT. The two TFT configuration is the simplest, but more complex circuitry may be used. The switching TFT switches between conductive and non-conductive in accordance with the output of the driving circuit. The current controlling TFT is applied a voltage according to an output of a driving circuit to the pixel electrode 303 so that a current flows between the opposite electrode and the pixel electrode. The intensity of light emitted from the organic compound layer 304 is dependent upon the amount of current flowing between the pixel electrode and the opposite electrode.

Pixel control circuits in AM-OLEDs operate in a different mode than pixel control circuits in AM-LCDs. In AM-LCD pixel control circuits, the TFTs operate as simple switching devices that open or close the pixel for data and thus require only a uniform threshold voltage for reliable operation. By contrast, the pixel TFTs in AM-OLEDs actually provide the current for light emission. Therefore, an additional high degree of uniformity of carrier mobility is required. In practice, therefore, the pixel brightness in AM-OLEDs is much more sensitive to the microstructure of semiconductor crystals in the TFT than in AM-LCDs. It is preferred that a ~4% grain size uniformity is used in OLED applications as opposed to a ~10% grain size uniformity for LCD applications.

While there have been shown and described examples of the present invention, it will be readily apparent to those skilled in the art that various changes and modifications may be made therein without departing from the scope of the invention as defined by the appended claims. Accordingly, the invention is limited only by the following claims and equivalents thereto.

What is claimed is:

1. A system for preparing a semiconductor film for an active matrix display, the system comprising:
 a laser source providing laser pulses having a pulse frequency of greater than about 4 kHz and having an average power of greater than 100 W;
 laser optics that shape the laser beam into a line beam, the line beam having a length, a width and a length to width aspect ratio greater than 50, the shaped laser beam having a substantially uniform fluence along the length of the line beam;
 a stage for support a sample capable of translation in at least one direction;
 memory for storing a set of instructions, the instructions comprising:
 (a) irradiating a first region of the film with a first laser pulse to form a first molten zone, said first molten zone demonstrating a variation in width along its length to thereby define a maximum width ($W_{max}$) and a minimum width ($W_{min}$), wherein the first molten zone crystallizes upon cooling to form one or more laterally grown crystals wherein the crystals grow substantially perpendicular to the length of the line beam;
 (b) laterally displacing the film relative to the line beam in the direction of lateral crystal growth a distance that is greater than about one-half $W_{max}$ and less than $W_{min}$; and
 (c) irradiating a second region of the film with a second laser pulse to form a second molten zone having a shape that is substantially the same as the shape of the first molten zone, wherein the second molten zone crystallizes upon cooling to form one or more laterally grown crystals that are elongations of the one or more crystals in the first region,
 wherein laser optics are selected to provide $W_{max}$ less than $2 \times W_{min}$.

2. The system of claim 1, wherein the line beam is positioned at an angle relative to a position intended for a column of TFTs.

3. The system of claim 1, wherein the line beam is positioned at an angle relative to an edge of the substrate.

4. The system of claim 1, wherein the laser is a solid state laser.

5. The system of claim 1, wherein the laser is a excimer laser.

6. A system for preparing a semiconductor film for an active matrix display, the system comprising:
 a laser source providing laser pulses having a pulse frequency of greater than about 4 kHz and having an average power of greater than 100 W;
 laser optics that shape the laser beam into an line beam, the line beam having a length, a width and a length to width aspect ratio greater than 50, the shaped laser beam having a substantially uniform fluence along the length of the line beam;
 a stage for support a sample capable of translation in at least one direction;
 memory for storing a set of instructions, the instructions comprising:
 (a) irradiating a first portion of the film with a plurality of laser pulses, wherein the irradiated film crystallizes after each laser pulse to form one or more laterally grown crystals, wherein the crystals grow substantially perpendicular to the length of the line beam, and wherein the film is laterally displaced relative to the line beam at a constant velocity a first pulse translation distance in the direction of lateral crystal growth after a first laser pulse, to form a first crystalline region; and
 (b) without interruption of the film displacement relative to the line beam and in the direction of the lateral crystal growth, irradiating a second portion of the film with a plurality of laser pulses, wherein the irradiated film crystallizes after each laser pulse to form one or more laterally grown crystals and wherein the film is laterally displaced relative to the line beam at a constant velocity a second pulse translation distance in the direction of lateral crystal growth after each laser pulse, to form a second crystalline region,
 wherein said first pulse translation distance after said first laser pulse is different from said second pulse translation distance after said second laser pulse.

7. The system of claim 6, wherein the first and second pulse translation distances are achieved by varying the film velocity at a constant laser pulse rate.

8. The system of claim 6, wherein the predetermined width of the line beam is selected to avoid nucleation in a film region irradiation with the irradiation pattern.

9. The system of claim 6, wherein the first pulse translation distance is selected to provide columns of laterally grown crystals having location controlled grain boundaries that interrupt lateral crystal growth and are substantially perpendicular to the direction of lateral growth.

10. The system of claim 6, wherein each laser pulse forms a molten zone and the first pulse translation distance is greater than one-half the width of the molten zone and less than the width of the molten zone.

11. The system of claim 10, wherein said molten zone demonstrates a variation in width along its length to thereby define a maximum width ($W_{max}$) and a minimum width ($W_{min}$), and the first pulse translation distance is greater than about one-half $W_{max}$ and less than $W_{min}$.

12. The system of claim 6, wherein the second pulse translation distance is selected to provide laterally grown crystals extending substantially in the direction of film movement.

13. The system of claim 6, wherein each laser pulse forms a molten zone and the second pulse translation distance is less than one-half the width of the molten zone.

14. The system of claim 6, wherein each laser pulse forms a molten zone and the first pulse translation distance is greater than one-half the width of the molten zone and less than the width of the molten zone and the second pulse translation distance is greater than one-half the width of the molten zone and less than the width of the molten zone.

15. The system of claim 6, wherein the first pulse translation distance is selected to provide a first set of predetermined crystalline properties suitable for a channel region of a pixel TFT.

16. The system of claim 15, wherein the second pulse translation distance is selected to provide a second set of predetermined crystalline properties suitable for a channel region of an integration TFT.

17. The system of claim 16, wherein the second portion is wide enough to accommodate a pair of integration regions for two adjacent displays.

18. The system of claim 6, wherein the laser pulse is focused into a line beam using cylindrical optics.

* * * * *